US012727076B2

(12) United States Patent
Wang et al.

(10) Patent No.: US 12,727,076 B2
(45) Date of Patent: Sep. 1, 2026

(54) CIRCUIT BOARD WITH REFLECTIVE LAYERS HAVING HOLLOWS, AND AN ELECTRONIC APPARATUS

(71) Applicants: Hefei BOE Ruisheng Technology Co., Ltd., Hefei (CN); BOE Technology Group Co., Ltd., Beijing (CN)

(72) Inventors: Xiao Wang, Beijing (CN); Bing Zhang, Beijing (CN); Liang Gao, Beijing (CN); Jianwei Qin, Beijing (CN)

(73) Assignees: Hefei BOE Ruisheng Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 523 days.

(21) Appl. No.: 18/026,887

(22) PCT Filed: Mar. 31, 2022

(86) PCT No.: PCT/CN2022/084581
§ 371 (c)(1),
(2) Date: Mar. 17, 2023

(87) PCT Pub. No.: WO2023/184410
PCT Pub. Date: Oct. 5, 2023

(65) Prior Publication Data

US 2024/0306289 A1 Sep. 12, 2024

(51) Int. Cl.
*H05K 1/02* (2006.01)
*H05K 1/11* (2006.01)
(Continued)

(52) U.S. Cl.
CPC ........... *H05K 1/0274* (2013.01); *H05K 1/111* (2013.01); *H05K 3/22* (2013.01); *H10W 70/65* (2026.01);
(Continued)

(58) Field of Classification Search
CPC ........ H05K 1/0274; H05K 1/111; H05K 1/00; H05K 1/02; H05K 2201/094;
(Continued)

(56) References Cited

U.S. PATENT DOCUMENTS

2013/0077295 A1 3/2013 Hayashi
2015/0002953 A1 1/2015 Yoon
(Continued)

FOREIGN PATENT DOCUMENTS

CN 101383327 A 3/2009
CN 106873061 A 6/2017
(Continued)

OTHER PUBLICATIONS

Office Action received for Chinese Patent Application No. 202280000680.X, mailed on Dec. 25, 2025, 19 pages (12 pages of English Translation and 7 pages of Original Document).

*Primary Examiner* — Wael M Fahmy
*Assistant Examiner* — Tiberiu D Onuta
(74) *Attorney, Agent, or Firm* — ArentFox Schiff LLP; Michael Fainberg

(57) ABSTRACT

The present disclosure provides a circuit board, an electronic apparatus and a manufacturing method for a circuit board. The circuit board includes: a substrate; a plurality of pad zones on the substrate; and a first reflective layer, where the first reflective layer is located at the same side of the substrate as the plurality of pad zones, the first reflective layer includes a plurality of mutually spaced reflective patterns, a gap is provided between the adjacent reflective patterns, and the first reflective layer has a first hollow in a zone where each pad zone of the plurality of pad zones is located.

20 Claims, 15 Drawing Sheets

(51) Int. Cl.
*H05K 3/22* (2006.01)
*H10W 70/65* (2026.01)
*H10W 90/00* (2026.01)

(52) U.S. Cl.
CPC ...... *H10W 90/00* (2026.01); *H05K 2201/094* (2013.01); *H05K 2201/10106* (2013.01)

(58) Field of Classification Search
CPC ........... H05K 2201/10106; H05K 3/02; H01L 25/0655; H01L 25/0753; H01L 25/167; H01L 23/49838; H10H 20/85; H10H 20/856; G02F 1/136
See application file for complete search history.

(56) References Cited

U.S. PATENT DOCUMENTS

2015/0364663 A1* 12/2015 Morimura ............ H10H 20/857
438/28
2016/0252231 A1* 9/2016 Fujikawa ............. F21V 19/005
362/235
2017/0141260 A1* 5/2017 Chen .................... H10H 20/841
2018/0226549 A1* 8/2018 Nakabayashi ....... H10H 20/856
2019/0057989 A1 2/2019 Ishiwata et al.
2023/0027533 A1* 1/2023 Nakabayashi ...... H01L 25/0753
2023/0244105 A1* 8/2023 Park .................. G02F 1/133603

FOREIGN PATENT DOCUMENTS

| | | | |
|---|---|---|---|
| CN | 108417685 | A | 8/2018 |
| CN | 108780799 | A | 11/2018 |
| CN | 112669720 | A | 4/2021 |
| CN | 112908985 | A | 6/2021 |
| CN | 215526304 | U | 1/2022 |
| JP | 10161553 | A | 6/1998 |
| JP | 11126035 | A | 11/1999 |
| JP | 2001290137 | A | 10/2001 |
| KR | 20020038023 | A | 5/2002 |
| WO | 2013061228 | A1 | 5/2013 |
| WO | 2021065532 | A1 | 4/2021 |

* cited by examiner

| Warp value/mm | | | | | | | | | |
|---|---|---|---|---|---|---|---|---|---|
| Position mark | | 1 | 2 | 3 | 4 | 5 | 6 | 7 | 8 |
| Entire surface | Sample 1 | 1.4 | 1 | 1 | 0.6 | 1.2 | 1 | 1 | 0.65 |
| | Sample 2 | 1.2 | 1 | 1.05 | 0.5 | 1.15 | 1 | 1.15 | 0.5 |
| Single zone | Sample 3 | 0.65 | 0.5 | 0.5 | 0.3 | 0.65 | 0.5 | 0.5 | 0.15 |
| | Sample 4 | 0.5 | 0.45 | 0.5 | 0.3 | 0.65 | 0.5 | 0.5 | 0.1 |
| Single site | Sample 5 | 0.35 | 0.35 | 0.15 | 0.05 | 3.7 | 0.1 | 0.05 | 0.05 |
| | Sample 6 | 0.45 | 0.35 | 0.3 | 0.05 | 0.05 | 0.15 | 0.05 | 0.15 |

Fig. 17A

| | Warp value/mm | | | | | | | | | |
|---|---|---|---|---|---|---|---|---|---|---|
| Pre-bake a second reflective layer | Viscosity of an adhesive layer | Position mark | 1 | 2 | 3 | 4 | 5 | 6 | 7 | 8 |
| Not baked | 3000 Pa·s | Sample 1 | 3.55 | 4.75 | 3.15 | 0.45 | 4.7 | 4.25 | 3.7 | 0.35 |
| | | Sample 2 | 3.6 | 4.15 | 3.7 | 0.5 | 3.7 | 4.5 | 3.45 | 0.5 |
| Baked | | Sample 3 | 2.55 | 2.9 | 2.25 | 0.6 | 3.3 | 3.0 | 2.9 | 0.65 |
| | | Sample 4 | 2.4 | 3.2 | 2.4 | 0.7 | 3.5 | 3.1 | 2.7 | 0.5 |
| Not baked | 800 Pa·s | Sample 5 | 2.85 | 3.3 | 2.6 | 0.75 | 3.7 | 3.3 | 3.2 | 0.9 |
| | | Sample 6 | 3.3 | 3.6 | 2.4 | 0.65 | 3.85 | 3.85 | 3.1 | 0.5 |

Fig. 17B

CIRCUIT BOARD WITH REFLECTIVE LAYERS HAVING HOLLOWS, AND AN ELECTRONIC APPARATUS

The present application is a National Stage of International Application No. PCT/CN2022/084581, filed on Mar. 31, 2022, which is hereby incorporated by reference in its entirety.

FIELD

The present disclosure relates to the technical field of semiconductors, and particularly relates to a circuit board, an electronic apparatus and a manufacturing method for a circuit board.

BACKGROUND

Light-emitting diode (LED) display refers to a technology of arraying and miniaturizing a vast number of traditional LEDs, addressing the LEDs and transferring the LEDs to a circuit substrate, so as to form LEDs minimally spaced, and further reducing a length of the LEDs from millimeter to micron, so as to achieve ultra-high pixels and ultra-high resolution, thereby being adaptable to screens of various sizes theoretically.

SUMMARY

The present disclosure provides a circuit board, an electronic apparatus and a manufacturing method for a circuit board. The circuit board includes: a substrate; a plurality of pad zones on the substrate; and a first reflective layer, where the first reflective layer is at the same side of the substrate as the plurality of pad zones, the first reflective layer includes a plurality of reflective patterns which are mutually spaced, a gap is provided between the adjacent reflective patterns, and the first reflective layer is provided with a first hollow in a zone where each pad zone of the plurality of pad zones is located.

In a possible implementation mode, at least one pad zone of the plurality of pad zones is distributed in a zone surrounded with an outer contour of at least one of the plurality of reflective patterns.

In a possible implementation mode, a minimum size of any one of the reflective patterns is greater than a maximum size of a pad zone in the zone surrounded with the outer contour of the reflective pattern, and only one pad zone of the plurality of pad zones is distributed in the zone surrounded with the outer contour of at least one of the plurality of reflective patterns.

In a possible implementation mode, the outer contour of at least one of the plurality of reflective patterns is provided with a different shape from a pad zone in the zone surrounded with the outer contour of the reflective pattern.

In a possible implementation mode, the outer contour of at least one of the plurality of reflective patterns is provided with a shape of a circle, rectangle, polygon or oval, and the pad zone in the zone surrounded with the outer contour of the reflective pattern is provided with a shape of a rectangle.

In a possible implementation mode, the plurality of pad zones include first element pad zones and/or second element pad zones, and a number of pads or sizes of pads included in each of the first element pad zones is different from a number of pads or sizes of pads included in each of the second element pad zones.

In a possible implementation mode, the circuit board includes a plurality of device zones, where each of the device zones includes at least one of the first element pad zones and/or at least one of the second element pad zones; and at least one of the device zones the device zones is distributed in the zone surrounded with the outer contour of at least one of the plurality of reflective patterns.

In a possible implementation mode, at least one of the plurality of reflective patterns includes a first reflective sub-pattern and a second reflective sub-pattern; at least two of the first element pad zones in the same device zone are distributed in a zone surrounded with an outer contour of the first reflective sub-pattern and distributed in an array; and the second element pad zone in the same device zone is distributed in the second reflective sub-pattern.

In a possible implementation mode, in at least one of the plurality of reflective patterns, the first reflective sub-pattern and the second reflective sub-pattern are connected to each other and constitute an integrated structure.

In a possible implementation mode, a shape of an outer contour of an orthographic projection of at least one of the plurality of reflective patterns on the substrate is similar to a shape of a zone where the first element pad zone and the second element pad zone in the same device zone as the at least one of the plurality of reflective patterns are distributed.

In a possible implementation mode, all the reflective patterns are provided with the same shape.

In a possible implementation mode, at least two of the plurality of reflective patterns are provided with different shapes.

In a possible implementation mode, all the reflective patterns are distributed in an array; and minimum spacing between every two adjacent reflective patterns is the same in a first direction, and minimum spacing between every two adjacent reflective patterns is the same in a second direction.

In a possible implementation mode, a ratio of minimum spacing between two adjacent pad zones of the plurality of pad zones in the first direction to the minimum spacing between two adjacent reflective patterns in the first direction ranges from 3 to 10; and a ratio of minimum spacing between two adjacent pad zones of the plurality of pad zones in the second direction to the minimum spacing between two adjacent reflective patterns in the second direction ranges from 3 to 10.

In a possible implementation mode, the minimum spacing between two adjacent reflective patterns in the first direction is greater than 2 mm; and the minimum spacing e2 between two adjacent reflective patterns in the second direction is greater than 2 mm.

In a possible implementation mode, the first reflective layer is made of white ink.

In a possible implementation mode, the circuit board further includes a second reflective layer at one side of the first reflective layer facing away from the substrate.

In a possible implementation mode, the second reflective layer is provided with second hollows in zones where the pad zones are located; and an area of an orthographic projection of a second hollow on the substrate is greater than an area of an orthographic projection of the first hollow on the substrate, and the orthographic projection of the first hollow on the substrate is in the orthographic projection of the second hollow on the substrate.

In a possible implementation mode, an orthographic projection of a zone, excluding the second hollows, of the second reflective layer on the substrate at least covers an orthographic projection of the gap between two adjacent reflective patterns on the substrate.

In a possible implementation mode, the orthographic projection of the zone, excluding the second hollows, of the second reflective layer on the substrate partially overlaps an orthographic projection of at least one of the plurality of reflective patterns on the substrate.

In a possible implementation mode, in the circuit board, minimum spacing between all the second hollows and the pad zones in the orthographic projections are approximately the same.

In a possible implementation mode, in the first direction, minimum spacing between the second hollow and the pad zone in the orthographic projection is smaller than the minimum spacing between two adjacent pad zones of the plurality of pad zones.

In a possible implementation mode, an adhesive layer is between the second reflective layer and the first reflective layer.

In a possible implementation mode, a viscosity of the adhesive layer ranges from 800 Pa·s to 2000 Pa·s.

In a possible implementation mode, the second reflective layer includes a base material, a first film layer at one side of the base material away from the first reflective layer, and a second film layer at one side of the base material facing the first reflective layer.

In a possible implementation mode, scattering particles and/or microbubbles are dispersed in the base material.

In a possible implementation mode, a material of the base material includes polyethylene terephthalate or polypropylene; and a material of the first film layer includes titanium dioxide, and a material of the second film layer includes a white oil coating.

An embodiment of the present disclosure further provides an electronic apparatus. The electronic apparatus includes the circuit board provided in the embodiment of the present disclosure, and a plurality of first elements and/or a plurality of second elements, where each of the plurality of first elements is connected to a first element pad zone, and each of the plurality of second elements is connected to a second element pad zone.

In a possible implementation mode, all the first elements in the same device zone are connected to each other.

An embodiment of the present disclosure further provides a manufacturing method for the circuit board provided in the embodiment of the present disclosure. The manufacturing method includes: providing a substrate; and forming a first reflective layer with a plurality of reflective patterns which are mutually spaced at one side of the substrate.

In a possible implementation mode, the forming a first reflective layer with a plurality of reflective patterns which are mutually spaced at one side of the substrate includes: coating a first reflective film on one side of the substrate; and forming the first reflective layer, exposing at least part of the plurality of pad zones, with the plurality of reflective patterns which mutually spaced through a zoned exposure process, wherein at least one device zone is distributed on at least one of the plurality of reflective patterns.

In a possible implementation mode, the forming the first reflective layer with the plurality of reflective patterns which are mutually spaced at one side of the substrate includes: coating a first reflective film on one side of the substrate; and forming the first reflective layer, exposing at least part of the plurality of pad zones, with the plurality of reflective patterns which are mutually spaced through a zoned exposure process, wherein one pad zone of the plurality of pad zones is distributed on at least one of the plurality of reflective patterns.

In a possible implementation mode, after the forming the first reflective layer with the plurality of reflective patterns which are mutually spaced at one side of the substrate, the manufacturing method further includes: providing a reflective structure, where the reflective structure includes a second reflective layer, an adhesive layer at one side of the second reflective layer, a first protective layer at one side of the adhesive layer facing away from the second reflective layer, and a second protective layer at one side of the second reflective layer facing away from the adhesive layer; baking the reflective structure, and making a baking temperature higher than an initial temperature Tg, where the initial temperature Tg is a temperature at which a cooling rate does not match a volume discharge rate; removing the first protective layer of the reflective structure which is cooled, and attaching the second reflective layer to one side of the first reflective layer facing away from the substrate by means of the adhesive layer; and removing the second protective layer.

BRIEF DESCRIPTION OF THE DRAWINGS

FIG. 17A is a first schematic comparison diagram of warp values of a circuit board under different conditions according to an embodiment of the present disclosure.

FIG. 17B is a second schematic comparison diagram of warp values of a circuit board under different conditions according to an embodiment of the present disclosure.

DETAILED DESCRIPTION OF THE EMBODIMENTS

Figure 1:
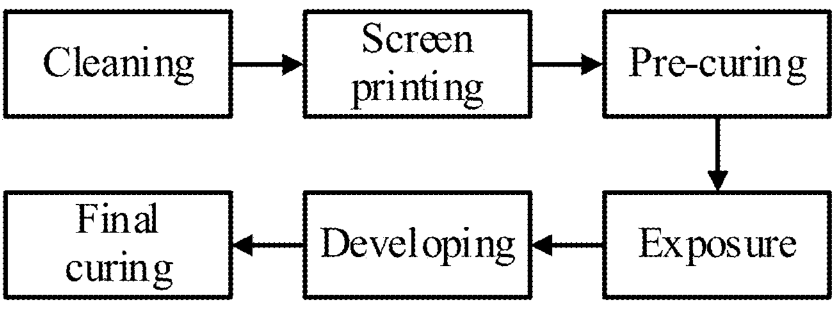
FIG. 1 is a schematic flow diagram of a formation process of a white oil layer.

For making objectives, technical solutions and advantages of embodiments of the present disclosure clearer, the technical solutions of the embodiments of the present disclosure will be clearly and completely described below in conjunction with the accompanying drawings in the embodiments of the present disclosure. Apparently, the embodiments described are some embodiments rather than all embodiments of the present disclosure. Based on the embodiments of the present disclosure, all other embodiments obtained by those of ordinary skill in the art without making creative efforts fall within the scope of protection of the present disclosure.

Unless otherwise defined, technical or scientific terms used in the present disclosure should have ordinary meanings as understood by those of ordinary skill in the art to which the present disclosure belongs. "First", "second", and other similar words used in the present disclosure do not indicate any order, amount or importance, but are only used to distinguish different components. "Include", "comprise", and other similar words indicate that elements or objects before the word include elements or objects after the word and their equivalents, without excluding other elements or objects. "Connecting", "connected", and other similar words are not limited to physical or mechanical connections, but can include electrical connections, which can be direct or indirect. "Upper", "lower", "left" and "right" are only used to indicate a relative positional relation. After an absolute position of the described object changes, the relative positional relation may also change accordingly.

"About" or "approximately the same" used herein includes the stated value and means that the value is within a deviation range that is acceptable to a specific value and is determined by those of ordinary skill in the art in consideration of related errors (that is, limitations of measurement systems) between described measurement and specific quantity measurement. For example, "approximately the same" can mean that a difference from the stated value is within one or more standard deviation ranges, or within ranges of +/−30%, 20%, 10%, and 5%.

In the drawings, thicknesses of layers, films, panels, zones, etc. are enlarged for clarity. Exemplary implementation modes are described herein with reference to a cross sectional view regarded as a schematic diagram of an idealized implementation mode. In this way, deviations between shapes of results caused by, for example, manufacturing technologies and/or tolerances and shapes in the drawing will be expected. Therefore, the implementation modes described herein should be interpreted as being not limited to specific shapes of zones as shown herein, but including deviations in shapes caused by, for example, manufacturing. For example, zones illustrated or described as flat can typically have rough and/or nonlinear features. Furthermore, sharp corners shown can be a circle. Therefore, the zones illustrated in the figures are schematic in nature, and their shapes are not intended to illustrate exact shapes of the zones, and are not intended to limit the scope of the claims.

To keep the following description of the embodiments of the present disclosure clear and concise, detailed descriptions of known functions and components are omitted in present disclosure.

Figure 2:
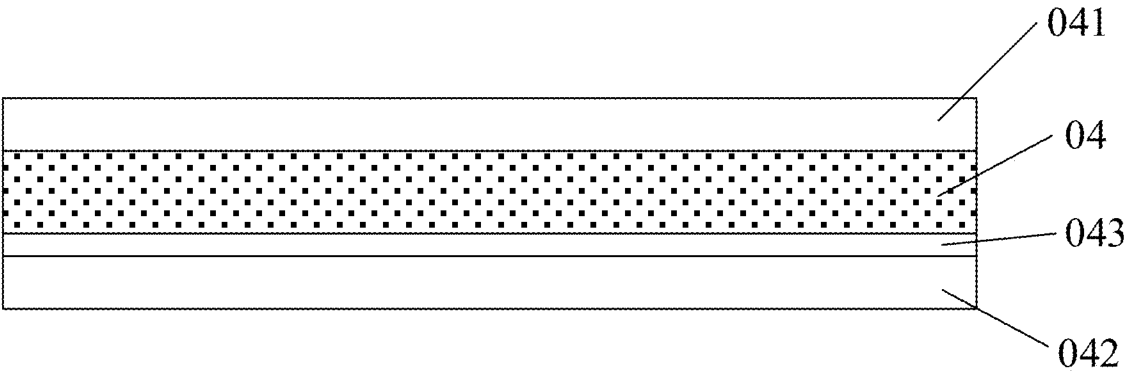
FIG. 2 is a schematic diagram of a section of a structure of a reflective plate.

In the related art, for a passive display panel, a backlight source is required to provide display brightness. In order to ensure high brightness, a reflective structure with high reflectivity is essential in the backlight source, such that emergent efficiency of light is maximized, and brightness is increased. For example, one of materials selected for a high-reflectivity film layer may be white ink. FIG. 1 shows a process flow of arranging a photosensitive white ink layer on a substrate, where the substrate is cleaned, and then a photosensitive white ink material in a solid-liquid mixed state is printed on a specific zone of the substrate and then is pre-cured and finally cured, such that the photosensitive white ink layer with high reflectivity may be obtained. For example, one of other options of the high-reflectivity film layer is a reflective plate, and the reflective plate is usually a multi-layered structure, as shown in FIG. 2, and may include, for example, a lower protective film 042, an adhesive film 043, a reflective layer 04, and an upper protective film 041. During use, the lower protective film 042 at the bottom is torn off, then the reflective layer 04 is firmly connected to a surface to be attached through viscosity of the adhesive film 043, and finally, the upper protective film 041 is torn off. Therefore, a white ink layer or a reflective layer may be selected in the backlight source, so as to improve light-emitting brightness. In some cases, the reflective plate may be arranged on the substrate provided with the white ink layer, such that reflectivity of the substrate is further increased, and energy consumption is reduced.

In a manufacturing process of the white ink layer, a white ink material needs to be cured to form the white ink layer, and the white ink material may generate tensile stress after curing, such that the substrate may warp.

Warp indicates that a flat cross section is no longer flat, that is, deformation is caused, which influences reliability and quality of products. For example, in a manufacturing process of wires, the substrate needs to be fixed through vacuum adsorption, and subsequent processes may be further conducted (such as a process of connecting components to pads on the substrate). However, a vacuum adsorption device also is provided with some limitations. If a warp value of the substrate is too great, the adsorption device cannot adsorb and fix a workpiece, and further the subsequent manufacturing processes cannot be conducted. For the substrate in the backlight source, an area of an orthographic projection of the white ink layer on the substrate is greater than 80% of an area of a flat face of the whole substrate, all parts of which are connected to each other. The inventor explores warping of the substrate after the white ink layer with the above pattern is arranged on the substrate. For a quadrilateral substrate provided with the white ink layer (for example, the area of the orthographic projection of the white ink layer on the substrate is greater than 90% of the area of the flat face of the whole substrate), in four zones close to four edges of the substrate, specific sites (for example, a total of 10 sites) are selected at equal intervals in each zone, so as to test warp values, and it is found that the warp values at a plurality of positions on the substrate exceed 2.6 mm. In this case, the vacuum adsorption device cannot adsorb and fix the substrate on a carrier, and further the substrate cannot be stably supported, accurately aligned or processed. Therefore, the warp values of the substrate have an important influence on the subsequent manufacturing processes.

The inventor further found that if the substrate is firstly provided with white ink and then provided with the reflective layer, the tensile stress generated after the white ink is cured may lead to increase in a warp degree of the substrate; the reflective layer 04 is attached to the white ink layer by means of the adhesive film 043 with high viscosity (>3000 Pa·s), and the stress and the warp degree of the substrate may be further increased under a baking condition of a subsequent high-temperature process (for example, at 150° C., a process section in which a protective structure is arranged on a component through a drip or printing process); and in addition, if a process temperature (100° C.-150° C.) in the subsequent manufacturing processes is higher than an initial temperature Tg of the reflective plate (the initial temperature Tg is a temperature when a cooling rate of the reflective plate does not match a volume discharge rate), the reflective layer 04 may shrink and show a warped shape. In this way, on one hand, subsequent manufacturing processes such as reliable connection between an electronic component (for example, a micro light-emitting diode) and the substrate, inspection and rework are influenced; and on the other hand, an overall yield of products is influenced.

For example, in an experiment, before no reflective plate is arranged on the white ink layer, a maximum warp value of the substrate is 1.55 mm for example; and after the reflective plate is arranged on the white ink layer, the maximum warp value of the substrate may be 4.75 mm (an allowable warp value of a device may be less than 2.6 mm) under a technological condition of +150° C. In this way, after the reflective plate is attached, the warp values of the substrate do not satisfy device requirements for subsequent processes. Therefore, there is an urgent need for a process method for improving warpage of a substrate.

Figure 3:
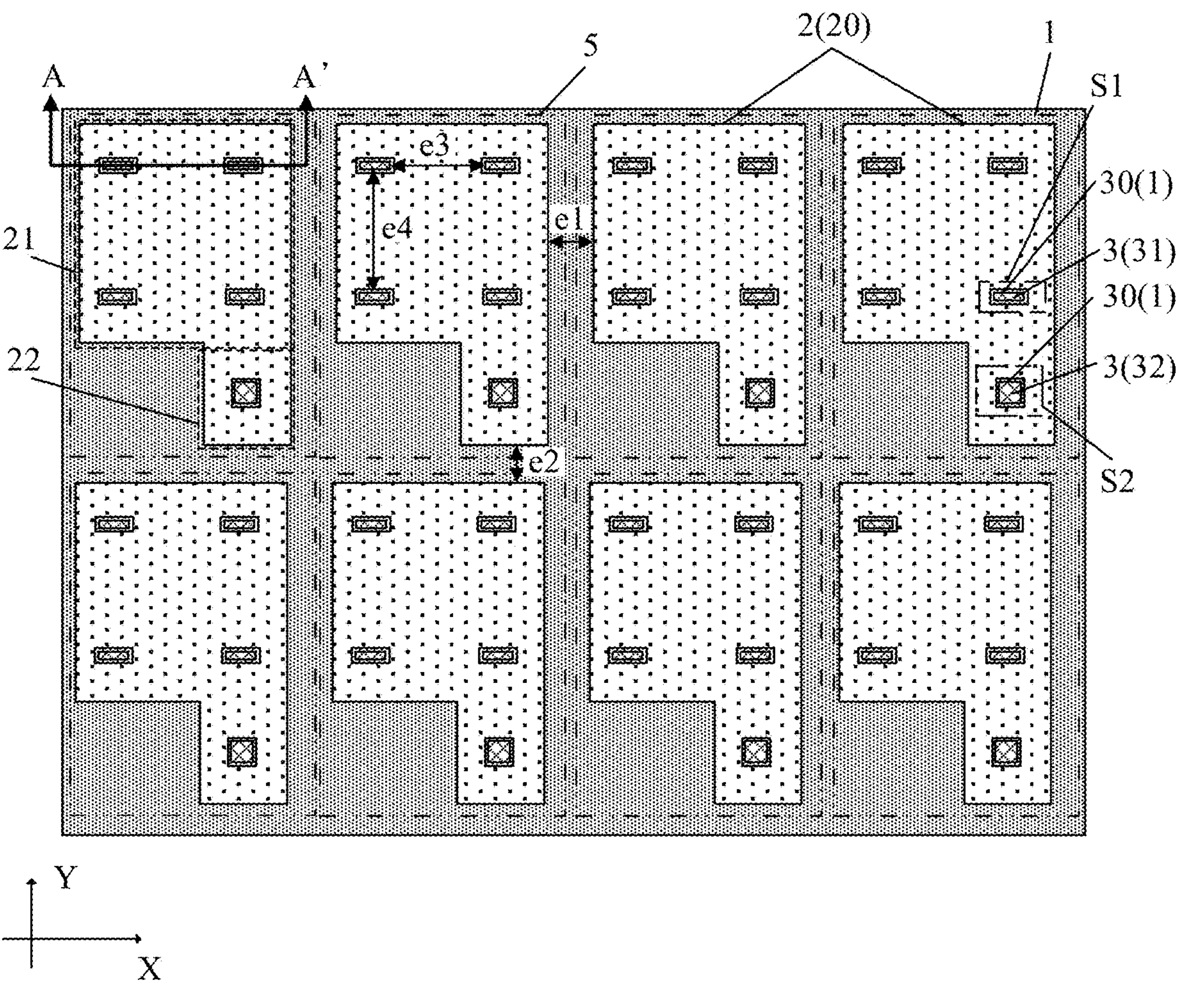
FIG. 3 is a first schematic diagram of a top view of a circuit board according to an embodiment of the present disclosure.
Figure 4:
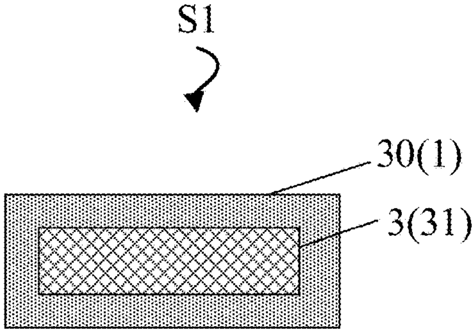
FIG. 4 is an enlarged schematic diagram of a dotted box S1 in FIG. 3.
Figure 5:
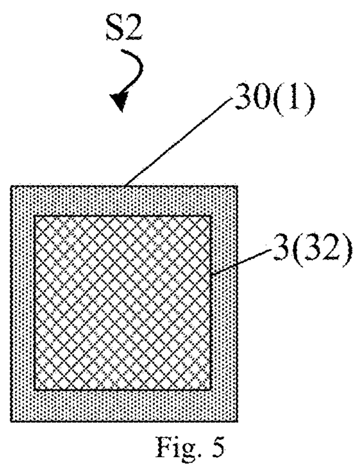
FIG. 5 is an enlarged schematic diagram of a dotted box S2 in FIG. 3.
Figure 12A:
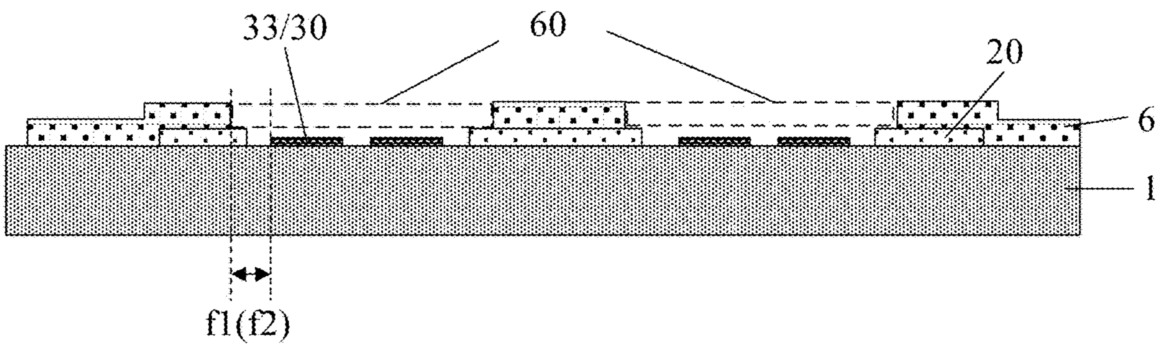
FIG. 12A is a first schematic diagram of a section of a circuit board according to an embodiment of the present disclosure.

In view of this, as shown in FIGS. 3-6 and FIG. 12A, FIG. 4 is an enlarged schematic diagram of a dotted box S1 in FIG. 3, FIG. 5 is an enlarged schematic diagram of a dotted box S2 in FIG. 3, and FIG. 12A is a schematic diagram of a section along a dotted line AA' in FIG. 3. An embodiment of the present disclosure provides a circuit board, which includes: a substrate 1; a plurality of pad zones 3 on the substrate 1; and a first reflective layer 20, where the first reflective layer 20 is located at the same side of the substrate 1 as the pad zones 3, the first reflective layer 20 includes a plurality of reflective patterns 2 which are mutually spaced, a gap is provided between adjacent reflective patterns 2, and the reflective patterns 2 have first hollows 30 in zones where the pad zones 3 are located. Specifically, zones exposed from the first hollows 30 are zones of the substrate 1.

In the embodiment of the present disclosure, the first reflective layer includes the plurality of reflective patterns 2 which are mutually spaced, and the gap is provided between the adjacent reflective patterns 2. The first reflective layer is formed into a film layer with the plurality of mutually spaced reflective patterns 2. Compared with a first reflective layer with all parts interconnected, a first film layer with the plurality of mutually spaced reflective patterns 2 may release tensile stress generated by the circuit board due to arrangement of the first reflective layer 20, and may greatly reduce a probability of warpage of the circuit board.

In a possible implementation mode, at least one pad zone 3 is distributed in the zone surrounded with an outer contour of each reflective pattern 2. For example, in FIG. 3, five pad zones 3 are distributed in the zone surrounded with an outer contour of one reflective pattern 2. Alternatively, in FIG. 6, one pad zone 3 is distributed in the zone surrounded with an outer contour of one reflective pattern 2. For example, the reflective pattern 2 includes a first reflective sub-pattern 21 and a second reflective sub-pattern 22, where one first element pad zone 31 is distributed on each first reflective sub-pattern 21, one second element pad zone 32 is distributed on each second reflective sub-pattern 22, and an area of the zone surrounded with an outer contour of the first reflective sub-pattern 21 is almost the same as an area of the zone surrounded with an outer contour of the second reflective sub-pattern 22. However, it may be understood that a size of the first hollow 30 of the first reflective sub-pattern 21 is adapted to a size and a shape of the first element pad zone 31, and designing is conducted on the premise of completely exposing each pad in the first element pad zone 31 and considering process accuracy; and a size of the first hollow 30 of the second reflective sub-pattern 22 is adapted to a size and a shape of the second element pad zone 32, and designing is conducted on the premise of completely exposing each pad in the second element pad zone 32 and considering process accuracy. Certainly, during specific implementation, other numbers of pad zones 3 may further be distributed in the zone surrounded with the outer contour of one reflective pattern 2, which is not limited in the embodiment of the present disclosure.

Figure 6:
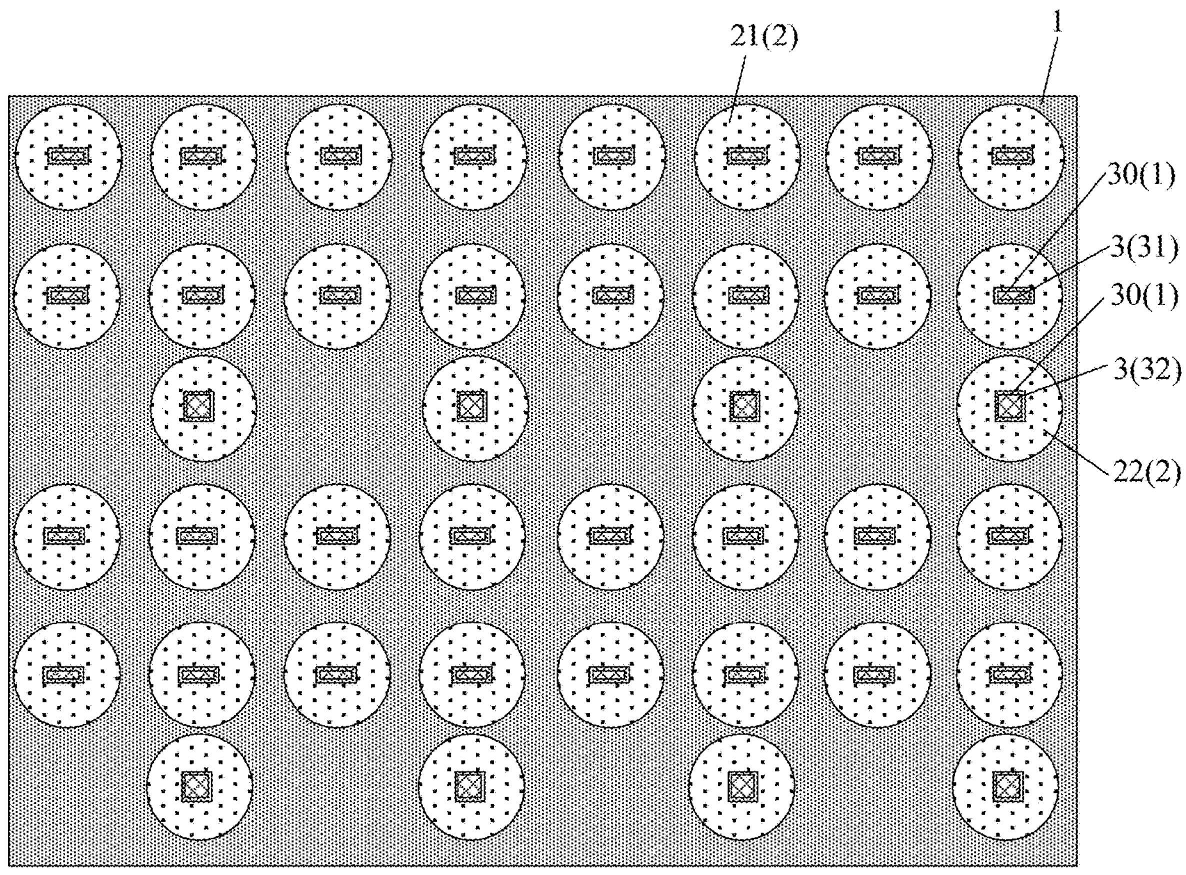
FIG. 6 is a second schematic diagram of a top view of a circuit board according to an embodiment of the present disclosure.

In a possible implementation mode, as shown in FIG. 6, a minimum size of the reflective pattern 2 is greater than a maximum size of the pad zone 3, and only one pad zone 3 is distributed in the zone surrounded with an outer contour of each reflective pattern 2. In the embodiment of the present disclosure, only one pad zone 3 is distributed in the zone surrounded with the outer contour of each reflective pattern 2. When the reflective patterns 2 are formed, different zones of a film layer on which the reflective patterns 20 are formed are exposed separately (one pad zone 3 is taken as one zone), and the first reflective layer may include a large number of reflective patterns with small single surface areas, such that the tensile stress generated by the circuit board due to arrangement of the first reflective layer 20 may be released more thoroughly, and the probability of warpage of the circuit board may be greatly reduced.

Specifically, the minimum size of the reflective pattern 2 may be understood as a perimeter of an outer contour of an orthographic projection of the reflective pattern 2 on the substrate 1, or a side length/diagonal line/diameter/long axis, etc. of a shape defined by the outer contour of the orthographic projection; and the maximum size of the pad zone 3 may be understood as a perimeter of an outer contour of an orthographic projection of the pad zone 3 on the substrate 1, or a side length/diagonal line/diameter, etc. of a shape defined by the outer contour of the orthogonal projection. For example, with FIG. 7A as an example, a shape defined by an outer contour of an orthographic projection of a reflective pattern 2 on the substrate 1 is a polygon, and a shape defined by an outer contour of an orthographic projection of a pad zone 3 on the substrate 1 is a quadrangle. A minimum size of the reflective pattern 2 may be understood as a length d1 of a shortest side of the polygon, a maximum size of the pad zone 3 may be understood as a length d2 of a long side of the rectangle, and d1>d2. It may be understood that corners of the polygon may be rounded. Alternatively, with FIG. 7B as an example, a shape defined by an outer contour of an orthographic projection of a reflective pattern 2 on the substrate 1 is a rectangle, and a shape defined by an outer contour of an orthographic projection of a pad zone 3 on the substrate 1 is a rectangle. A minimum size of the reflective pattern 2 may be understood as a length d1 of a short side of the rectangle, a maximum size of the pad zone 3 may be understood as a length d2 of a long side of the rectangle, and d1>d2. Alternatively, with FIG. 8 as an example, a shape defined by an outer contour of an orthographic projection of a reflective pattern 2 on the substrate 1 is a circle, and a shape defined by an outer contour of an orthographic projection of a pad zone 3 on the substrate 1 is a rectangle. A minimum size of the reflective pattern 2 may be understood as a diameter L0 of the circle, a maximum size of the pad zone 3 may be understood as a length d2 of a long side of the rectangle, and L0>d2.

In a possible implementation mode, the reflective patterns 2 have different shapes from the pad zones 3. For example, as shown in FIG. 3, shapes defined by outer contours of orthographic projections of reflective patterns 2 on the substrate 1 are polygons, and shapes defined by outer contours of orthographic projections of pad zones 3 on the substrate 1 are rectangles. Alternatively, as shown in FIG. 6, shapes defined by outer contours of orthographic projections of reflective patterns 2 on the substrate 1 are circles, and shapes defined by outer contours of orthographic projections of pad zones 3 on the substrate 1 are rectangles.

Figure 9:
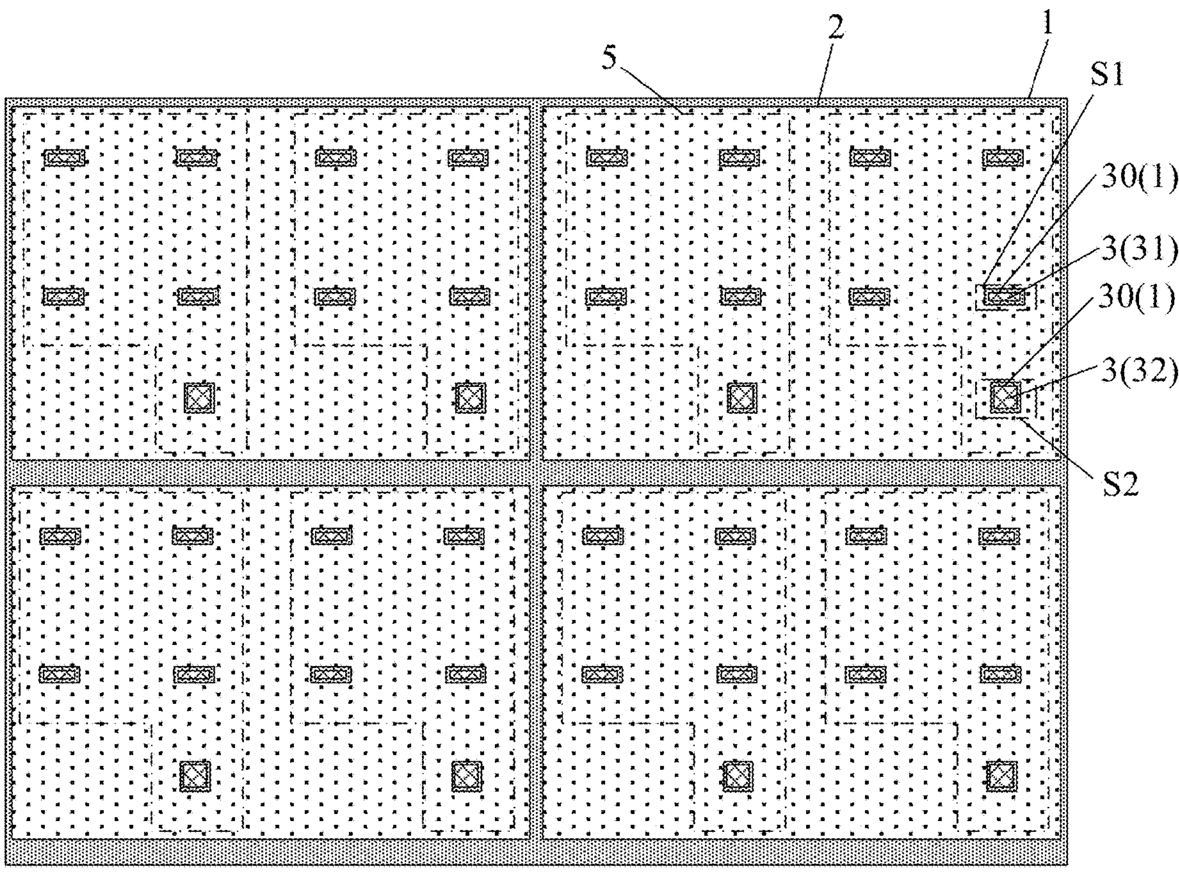
FIG. 9 is a third schematic diagram of a top view of a circuit board according to an embodiment of the present disclosure.
Figure 10:
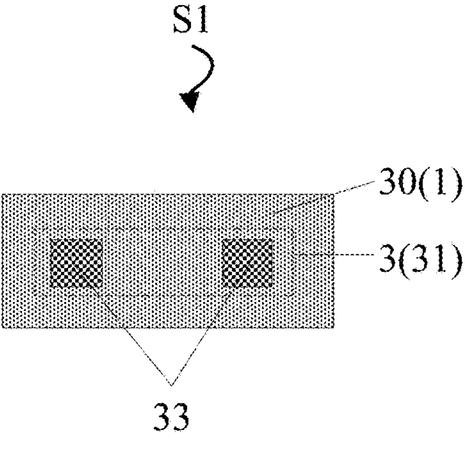
FIG. 10 is a schematic diagram of a first pad sub-zone including two pads according to an embodiment of the present disclosure.
Figure 11:
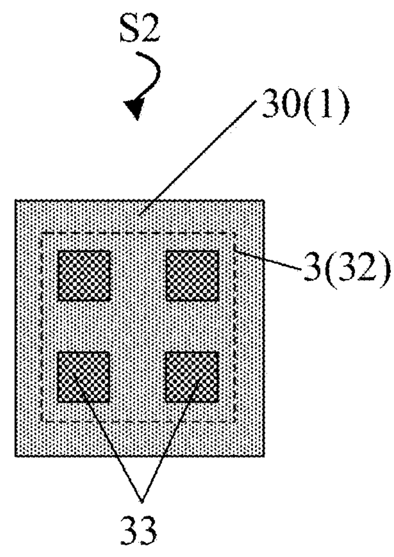
FIG. 11 is a schematic diagram of a second pad sub-zone including four pads according to an embodiment of the present disclosure.

In a possible implementation mode, as shown in FIG. 3 or 9, the plurality of pad zones 3 include first element pad zones 31 and/or second element pad zones 32, and the number of pads or sizes of pads included in each of the first element pad zones 31 is/are different from the number of pads or sizes of pads included in each of the second element pad zones 32. Specifically, for example, as shown in FIG. 10, the first element pad zone 31 includes two pads 33; and as shown in FIG. 11, the second element pad zone 32 includes at least four pads 33.

In a possible implementation mode, as shown in FIG. 3 or 9, the circuit board includes a plurality of device zones 5, where each device zone 5 includes at least one first element pad zone 31 and/or at least one second element pad zone 32; and at least one device zone 5 is distributed in the zone surrounded with an outer contour of a reflective pattern 2. In the embodiment of the present disclosure, at least one device zone 5 is distributed in a zone where the reflective pattern 2 is located. When the reflective patterns 2 are formed, different zones of a film layer on which the reflective patterns 2 are formed are exposed separately (a zone where at least one device zone 5 is distributed is taken as one zone), and at least one device zone 5 is distributed in the zone surrounded with an outer contour of each reflective pattern 2. Compared with a first reflective layer with all parts interconnected, the film layer in the present disclosure may release tensile stress generated by the circuit board due to arrangement of the first reflective layer 20, and may avoid warpage of the circuit board when the first reflective layer with all the parts interconnected is formed.

It should be noted that schematic illustration is conducted with FIG. 9 as an example in which two device zones 5 may be distributed in the zone surrounded with an outer contour of one reflective pattern 2, and during specific implementation, other numbers of device zones 5 may also be distributed in the zone surrounded with the outer contour of one reflective pattern 2, which are not limited in the embodiment of the present disclosure. For example, three device zones 5 may be distributed in the zone surrounded with the outer contour of one reflective pattern 2, alternatively, four device zones 5 may be distributed in the zone surrounded with the outer contour of one reflective pattern 2, and alternatively, five device zones 5 may be distributed in the zone surrounded with the outer contour of one reflective pattern 2.

In a possible implementation mode, as shown in FIG. 3, only one device zone 5 is distributed in the zone surrounded with an outer contour of each reflective pattern 2.

During specific implementation, the first element pad zone 31 may be configured to be welded to the first element, and the first element may be a light-emitting element, and for example, may be a mini light emitting diode (mini-LEDs). The mini-LED has a small size and high brightness, and may be widely used in a backlight module of a display apparatus and finely adjust backlight, such that high-dynamic range (HDR) images may be displayed. For example, a typical size (for example, a length) of the mini-LED is in a range of 50 μm-200 μm, for example, 80 μm-150 μm.

During specific implementation, the second element pad zone 32 may be configured to be welded to the second element. Specifically, the second element may be a micro control chip, a micro sensor, a capacitor, an inductor, a resistor, etc. Specifically, a plurality of first pad zones 31 of one device zone 5 are welded to a plurality of light-emitting elements in one-to-one correspondence, and then second pad zone 32 is welded to the micro control chip correspondingly, such that one light-emitting zone is formed. In this way, the micro control chip in one light-emitting zone may control light emission of the plurality of light-emitting elements in the light-emitting zone, so as to achieve zoned control and local dimming of the circuit board.

Specifically, the mini-LED may include two pins (pins N and P), which are welded to two pads 33 of the first element pad zone 31 correspondingly. The micro control chip may include at least four pins, which may be welded to a plurality of pads 33 of the second element pad zone 32 in one-to-one correspondence. When a reflective pattern 2 is formed, one first hollow 30 exposes both the pads 33 configured to be bonded to two pins of the mini-LED or all four pads 33 configured to be bonded to four pins of the micro control chip.

The circuit board may be divided into a plurality of device zones arranged in an array, and each device zone at least includes a first element pad zone configured to be connected to at least one first element. In some embodiments, each device zone further includes a second element pad zone connected to at least one second element. The first element pad zones are configured to be connected to the first elements for achieving a main function of the circuit board, and the second element pad zones are configured to be connected to the second elements that cooperate with the first elements to achieve a corresponding function. For example, the first elements may include mini-LEDs, and the main function of the circuit board is to provide illumination. The second elements may include micro control chips configured to provide control signals for the mini-LEDs, alternatively, may include micro sensor chips configured to sense signals of electrical structures/devices on circuit boards such as mini-LEDs, and alternatively, may include common electronic components such as capacitors, inductors and resistors.

In a possible implementation mode, as shown in FIG. 3, the reflective patterns 2 include first reflective sub-patterns 21 and second reflective sub-patterns 22, at least two first element pad zones 31 belonging to the same device zone 5 are distributed in a zone where the first reflective sub-pattern 21 are located, and the second element pad zone 32 in the same device zone 5 are distributed on the second reflective sub-pattern 22.

In a possible implementation mode, as shown in FIG. 3, in at least one of the reflective patterns 2, the first reflective sub-pattern 21 and the second reflective sub-pattern 22 are connected to each other and constitute an integrated structure.

In some embodiments, as shown in FIG. 3, all the reflective patterns 2 and all the device zones are arranged in one-to-one correspondence, which means being distributed in an array. Minimum spacing e1 between two adjacent reflective patterns 2 is the same in a first direction X, and minimum spacing e2 between two adjacent reflective patterns 2 is the same in a second direction Y. The first reflective sub-pattern 21 may have a shape of a rectangle, and the second reflective sub-pattern 22 may have a shape of a rectangle. In the same direction, the first reflective sub-pattern 21 may have a size greater than a size of the second reflective sub-pattern 22. All the second reflective sub-patterns 22 are located at the same side as all the first reflective sub-patterns 21. For example, as shown in FIG. 3, each of the second reflective sub-patterns 22 extend from the first reflective sub-pattern 21 in the second direction Y, so as to form an integrated structure.

In a possible implementation mode, as shown in FIG. 3, in the first direction X, a ratio of a minimum spacing e3 between two adjacent pad zones 3 to the minimum spacing e1 between two adjacent reflective patterns 2 ranges from 3 to 10; and in the second direction Y, a ratio of a minimum spacing e4 between two adjacent pad zones 3 to the minimum spacing e2 between two adjacent reflective patterns 2 ranges from 3 to 10.

It may be understood that the first direction intersects with the second direction; and the plurality of pad zones are arranged at intervals in the first direction and/or the second direction. In some embodiments, the first direction is perpendicular to the second direction, as shown in FIG. 3, and any two adjacent pad zones of the plurality of pad zones are distributed at an interval in the first direction or the second direction; alternatively, any two adjacent pad zones of the plurality of pad zones may be distributed at an interval in a direction with a certain included angle with the first direction or the second direction, the included angle being 0°-60°; and alternatively, at least two pad zones of the plurality of pad zones are distributed at an interval in the first direction, and meanwhile, at least two pad zones of the plurality of pad zones are distributed at an interval in the second direction.

In a possible implementation mode, as shown in FIG. 3, minimum spacing e1 between two adjacent reflective patterns 2 is greater than 2 mm in the first direction X, and minimum spacing between two adjacent reflective patterns is greater than 2 mm in the second direction Y. In the embodiment of the present disclosure, the minimum spacing e1 between two adjacent reflective patterns 2 is greater than 2 mm in the first direction X, and the minimum spacing e2 between two adjacent reflective patterns 2 is greater than 2 mm in the second direction Y, such that the adjacent reflective patterns 2 may have a clear dividing line under the condition of allowable accuracy of exposure and development devices, and further the tensile stress generated by the circuit board due to arrangement of the first reflective layer 20 may be released.

Specifically, e1 and e2 may be approximately the same, and e3 and e4 may be approximately the same. Specifically, 2 mm<e1<50 mm, and 2 mm<e2<50 mm. Specifically, 6 mm<e3<100 mm, and 6 mm<e4<100 mm.

Figure 7A:
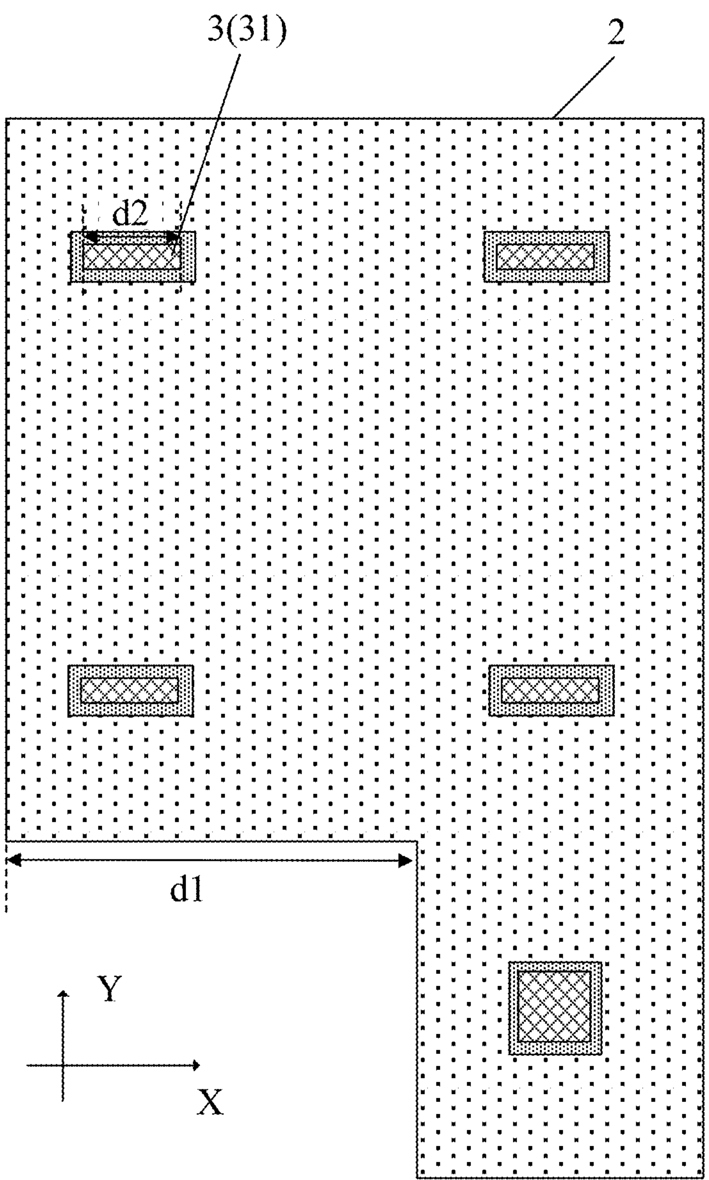
FIG. 7A is a first enlarged schematic diagram of a reflective pattern according to an embodiment of the present disclosure.
Figure 7B:
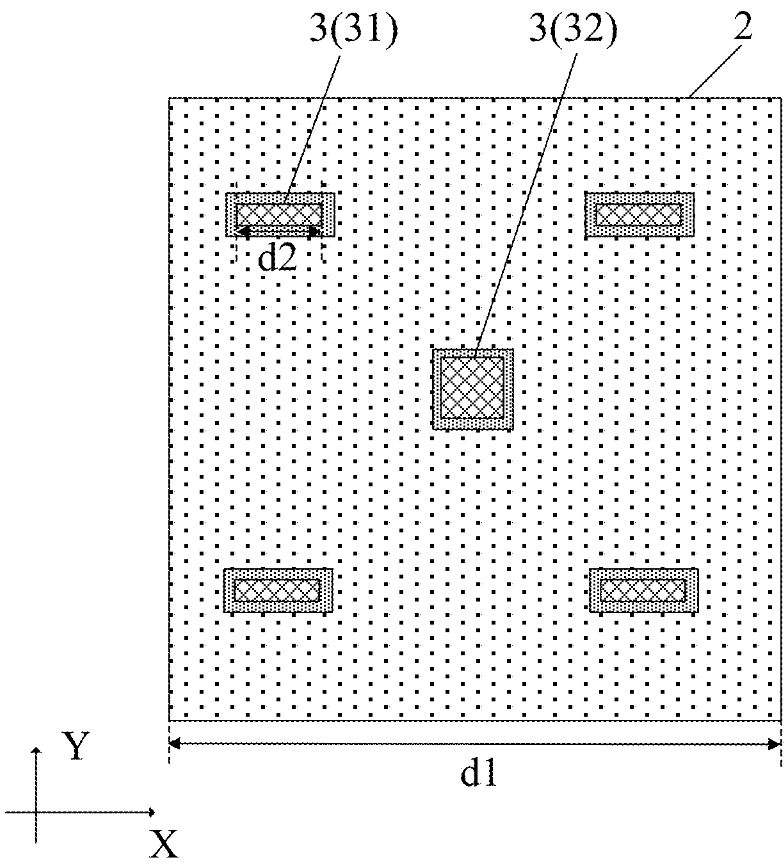
FIG. 7B is a schematic diagram of a reflective pattern with a rectangular shape according to an embodiment of the present disclosure.
Figure 8:
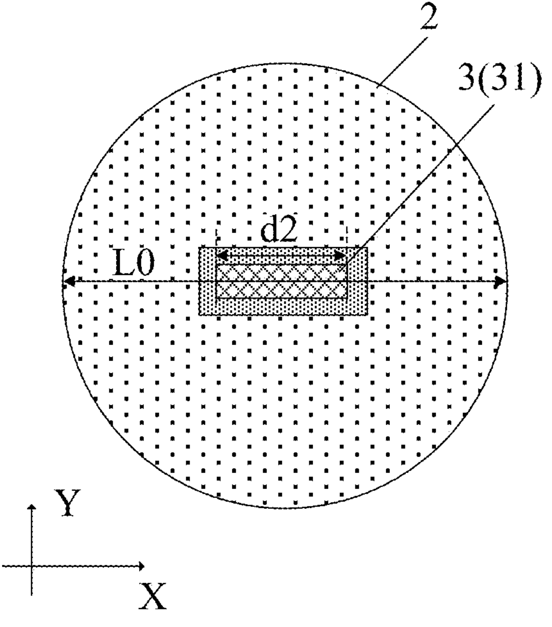
FIG. 8 is a second enlarged schematic diagram of a reflective pattern according to an embodiment of the present disclosure.

In a possible implementation mode, as shown in FIG. 3, a shape of an outer contour of an orthographic projection of a reflective pattern 2 on the substrate 1 is similar to a shape of a zone where the first element pad zone 31 and the second element pad zone 32 in the same device zone 5 as the reflective pattern 2 are distributed. Specifically, for example, as shown in FIG. 7A, if a shape of the zone where the first element pad zone 31 and the second element pad zone 32 in the device zone 5 are distributed is like a "kitchen knife", a shape of the outer contour of the orthographic projection of the reflective pattern 2 on the substrate 1 and in the same device zone 5 is also like a "kitchen knife". Certainly, a shape of the zone where the first element pad zone 31 and the second element pad zone 32 in the same device zone 5 are distributed may also be another shape. Alternatively, as shown in FIG. 7B, if the shape of the zone where the first element pad zone 31 and the second element pad zone 32 in the device zone 5 are distributed is a rectangle, a shape of the outer contour of the orthographic projection of the reflective pattern 2 on the substrate 1 and in the same device zone 5 may also have a shape of a rectangle.

In a possible implementation mode, as shown in FIG. 3, outer contours of all the reflective patterns 2 have the same shape.

In a possible implementation mode, at least two reflective patterns 2 have different shapes. Specifically, differences between the shapes may be caused by the different number of elements distributed in the surrounded zone, and alternatively, differences between the shapes may be caused by different types of elements and/or different distribution densities of elements under the condition of the same number of elements.

In a possible implementation mode, the first reflective layer is made of thermosetting white ink or photosensitive white ink.

Figure 12B:
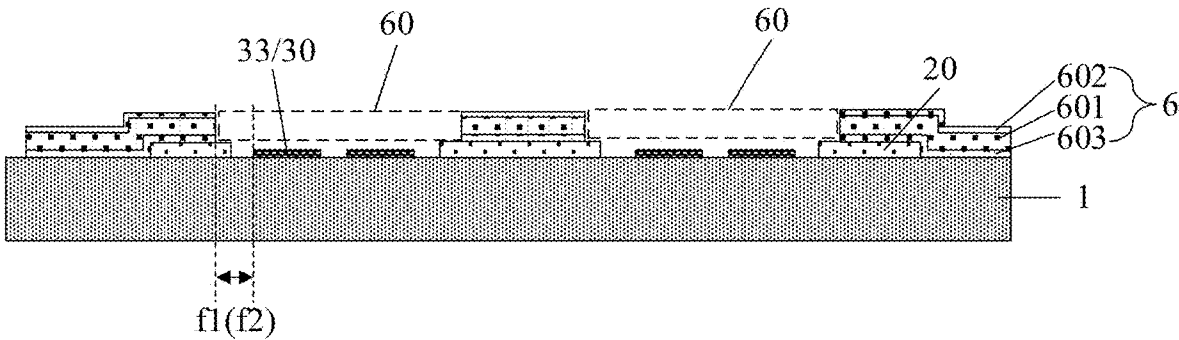
FIG. 12B is a second schematic diagram of a section of a circuit board according to an embodiment of the present disclosure.
Figure 13:
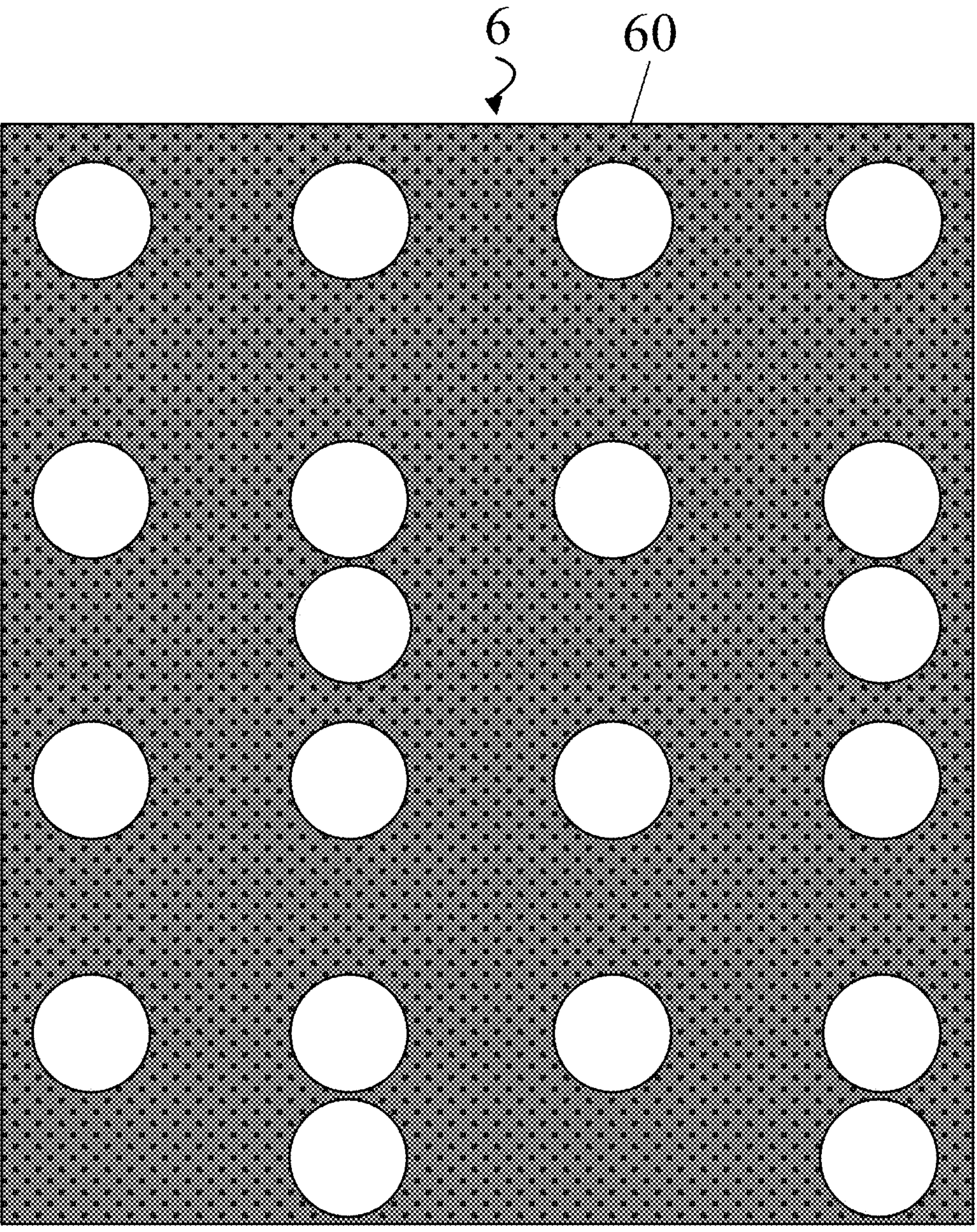
FIG. 13 is a schematic diagram of a top view of a second reflective layer according to an embodiment of the present disclosure.
Figure 14:
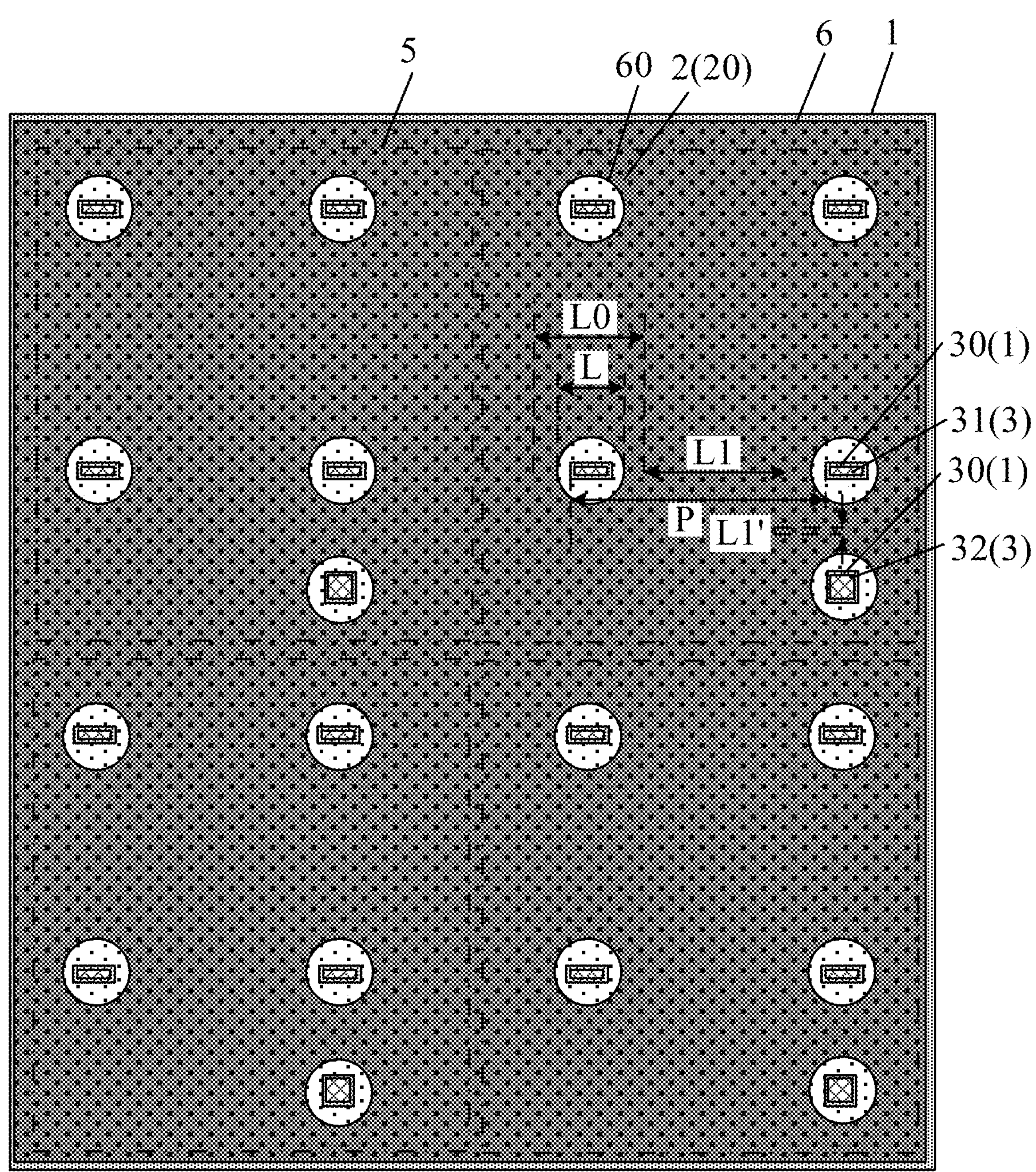
FIG. 14 is a fourth schematic diagram of a top view of a circuit board according to an embodiment of the present disclosure.
Figure 15:
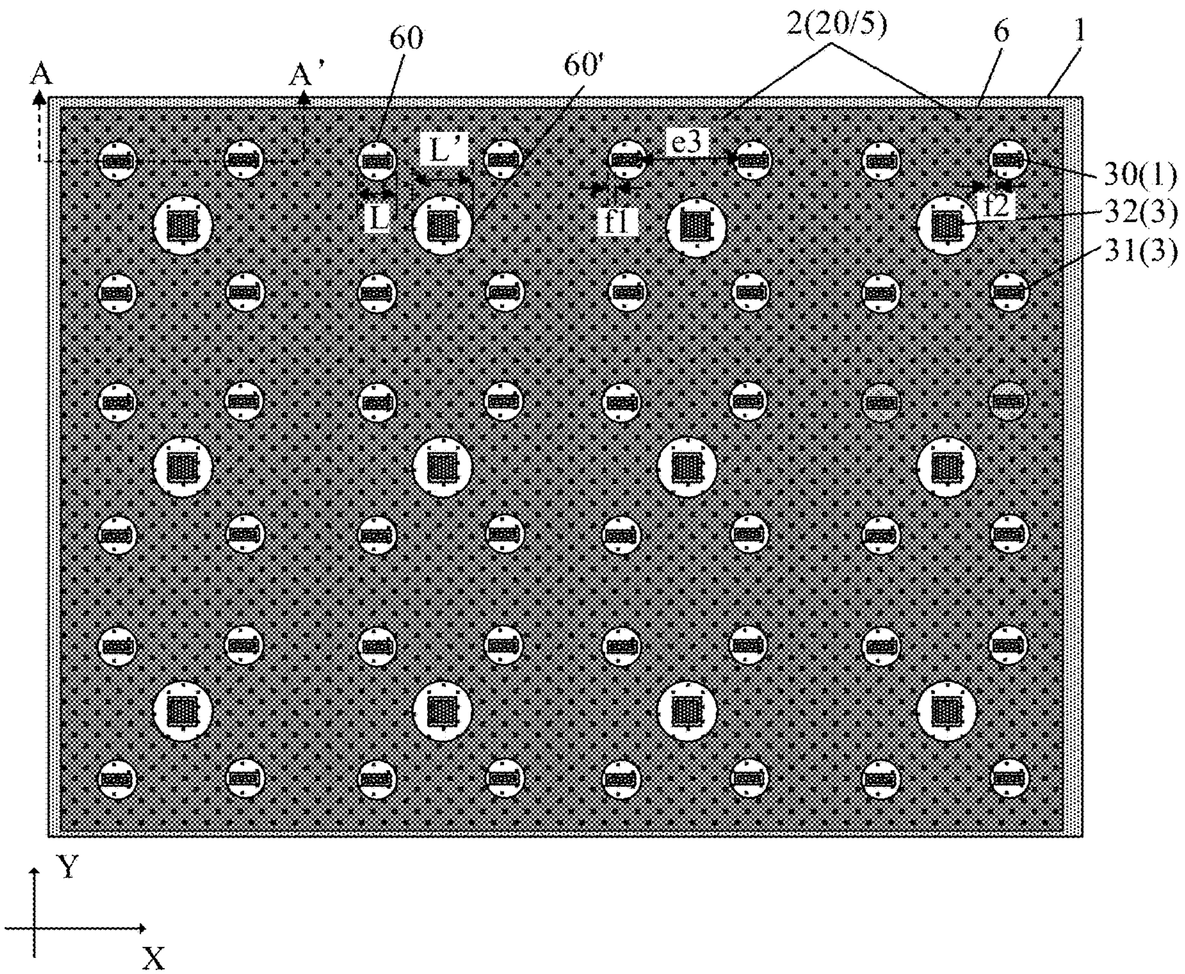
FIG. 15 is a fifth schematic diagram of a top view of a circuit board according to an embodiment of the present disclosure.

Specifically, white ink may reflect light to a light emitting side of the circuit board, so as to increase a light utilization rate. However, in an actual process, a thickness of the first reflective layer is uneven due to a preparation process, such that color difference may occur at different positions, and an uneven reflection effect is further caused. In a possible implementation mode, as shown in FIGS. 12A-14, FIG. 12A is a schematic diagram of a section of a circuit board, FIG. 13 is a schematic diagram of a top view of a second reflective layer 6, FIG. 15 is a schematic diagram of a top view of a circuit board provided with a second reflective layer, and FIG. 14 is another schematic diagram of a top view of a circuit board provided with a second reflective layer. The circuit board further includes the second reflective layer 6 at one side of a first reflective layer 20 facing away from a substrate 1. The second reflective layer 6 may be arranged at one side of the first reflective layer 20 facing away from the substrate 1 in attached or other manners, and the second reflective layer 6 may further improve a light utilization rate and improve an uneven reflection effect between different device zones 5.

In a possible implementation mode, the second reflective layer 6 may be a reflective plate, and may be a reflective layer attached to or stacked on one side of the first reflective layer 20 facing away from the substrate 1. Specifically, as shown in FIG. 12B, FIG. 12B is another schematic diagram of a section along a dotted line AA' in FIG. 3. The second reflective layer 6 may include a base material 601, a first film layer 602 at one side of the base material 601 away from the first reflective layer 20, and a second film layer 602 at one side of the base material 601 facing the first reflective layer 20. Specifically, scattering particles and/or microbubbles may be dispersed in the base material 601. Specifically, the scattering particles may be made of titanium dioxide. Specifically, the base material 601 may be made of polyethylene terephthalate or polypropylene. Specifically, the first film layer 602 may be a scattering layer, the first film layer 602 may be made of titanium dioxide, and the second film layer 603 may be a reflective material layer, and specifically, may be made of a white ink material.

In a possible implementation mode, as shown in FIGS. 12A-14, the second reflective layer 6 has second hollows 60 in zones where pad zones 3 are located; and an area of an orthographic projection of each of the second hollows 60 on the substrate 1 is greater than that of an orthographic projection of each of the first hollows 30 on the substrate 1, and the orthographic projection of the first hollow 30 on the substrate 1 is located in the the orthographic projection of the second hollow 60 on the substrate 1. In the embodiment of the present disclosure, the area of the orthographic projection of the second hollow 60 on the substrate 1 is greater than that of the orthographic projection of the first hollow 30 on the substrate 1, and the orthographic projection of the first hollow 30 on the substrate 1 is located in the orthographic projection of the second hollow 60 on the substrate 1, such that light emission of light-emitting elements welded to the pad zones 3 may be fully ensured, and the second hollows 60 may be prevented from influencing the light emission of the light-emitting elements.

In a possible implementation mode, as shown in FIGS. 12A-14, in the circuit board, minimum spacing between each of the second hollows 60 and each of the pad zones 3 in the orthographic projection is approximately the same. Specifically, for example, as shown in FIG. 15 or 14, in a direction parallel to a first direction X, in a non-edge zone of the circuit board, minimum spacing between a second hollow 60 and a pad zone 3 in an orthographic projection of the second hollow is f1, and in an edge zone of the circuit board, minimum spacing between a second hollow 60 and a pad zone 3 in the orthographic projection of the second hollow is f2, where f1 and f2 are approximately the same. During specific implementation, for the second reflective layer 6 in the embodiment of the present disclosure, the second reflective layer 6 may be baked at a high temperature before the second reflective layer 6 is formed on the circuit board. When a baking temperature T is higher than an initial temperature Tg, a free volume of a reflective plate is released, and then cooling is conducted naturally to reach a room temperature, such that the second reflective layer may shrinks to a free volume corresponding to the room temperature. When the second reflective layer 6 is under a high temperature condition again in subsequent manufacturing processes, a volume of the second reflective layer does not decrease/only slightly decreases, such that a warp value of the circuit board may be reduced. In the second reflective layer 6 that is baked at a high temperature and then naturally cooled, minimum spacing between all the second hollows 60 and the pad zones 3 in the orthographic projections in different zones of the circuit board may be approximately the same. In this way, the problems that when a second reflective layer 6 that is not baked at a high temperature is attached to a first reflective layer 20, differences between sizes of second hollows 6 in a non-edge zone and an edge zone of the second reflective layer 6 may be caused when the second reflective layer 6 is stretched during attachment, such that after the second reflective layer is attached to the first reflective layer 20, spacing between all the pad zones 3 and the second hollows 60 where the pad zones 3 are located in the same direction in different zones of the circuit board may be different, which further leads to uneven brightness of light emission in the different zones of the circuit board, may be avoided.

In a possible implementation mode, minimum spacing between the second hollow 60 and the pad zone 3 in the orthographic projection is f1 and is smaller than minimum spacing e3 between two adjacent pad zones 3 in the first direction X. Specifically, the minimum spacing f1 between the second hollow 60 and the pad zone 3 in the orthographic projection may satisfy 0.45 mm<f1<1 mm.

It should be noted that the second reflective layer 6 that is processed at a high temperature and then naturally cooled may still not be able to keep spacing between all the pad zones 3 and the second hollows 60 where the pad zones 3 are located exactly the same in the same direction due to actual process errors (for example, process errors such as device alignment). Therefore, in the embodiment of the present disclosure, the spacing between all the pad zones 3 and the second hollows 60 where the pad zones 3 are located in the same direction is approximately the same, which can be understood as that a ratio of a difference between spacing between pad zones 3 and second hollows 60 where the pad zones 3 are located in the same direction in any two zones of the circuit board to spacing between a pad zone 3 and a second hollow 60 where the pad zone 3 is located in the same direction in either of the zones is smaller than 10%. Specifically, for example, as shown in FIG. 14, a difference between f1 and f2 is a1 in an inner zone of the circuit board, and a difference between f1 and f2 is a2 in an edge zone of the circuit board, such that a1/f1<±10%, a2/f2<=10%.

In a possible implementation mode, as shown in FIGS. 12A, 15 and 14, an orthographic projection of a zone, excluding the second hollows 60, of the second reflective layer 6 on the substrate 1 at least covers an orthographic projection of the gap between two adjacent reflective patterns 2 on the substrate 1. In the embodiment of the present disclosure, the orthographic projection of the second reflective layer 6 on the substrate 1 at least covers the orthographic projection of the gap between the adjacent reflective patterns 2 on the substrate 1, such that the gap between the adjacent reflective patterns 2 may be shielded, positions without reflective patterns 2 on the circuit board may be covered with the second reflective layer 6 arranged later, and optical performance of a product cannot be influenced.

In a possible implementation mode, as shown in FIGS. 12A, 15 and 14, the orthographic projection of the zone, excluding the second hollow 60, of the second reflective layer 6 on the substrate 1 partially overlaps the orthographic projection of the reflective pattern 2 on the substrate 1. For example, as shown in FIG. 15 or 14, the orthographic projection of the zone, excluding the second hollow 60, of the second reflective layer 6 on the substrate 1 further covers a peripheral parts of the first hollow 30 of the reflective pattern 2, that is, the orthographic projection of the second hollow 60 on the substrate 1 has a size smaller than a size of the orthographic projection of the reflective pattern 2 on the substrate 1, and further it is ensured that a zone, not covered with the reflective pattern 2, on the circuit board may be partially covered with the second reflective layer 6, and the optical performance of the product is improved.

During specific implementation, as shown in FIG. 14, on one hand, a minimum size L of a second hollow 60 in the second reflective layer 6 is determined by a processing technology, with a second hollow 60 with a shape of a circle as an example, a minimum size of the second hollow 60 refers to a diameter of the second hollow 60, and a minimum diameter manufactured by a current processing method is about 1.5 mm; and on the other hand, a size L0 of an outer contour of a reflective pattern 2 is related to L, one reflective pattern 2 surrounds at least one pad zone 3, and adjacent reflective patterns 2 are spaced apart from each other. Therefore, a maximum size L0 of the outer contour of the reflective pattern 2 is related to spacing between adjacent elements on the circuit board. It may be understood that if a shape of an outer contour of a reflective pattern 2 is a polygon, a maximum size refers to a diagonal length of the polygon, if a shape of an outer contour of a reflective pattern 2 is a circle, a maximum size refers to a diameter of the circle, and if a shape of an outer contour of a reflective pattern 2 is an oval, a maximum size refers to a long axis length of the oval. In design, L0 is required to be slightly greater than L, and for example, L0>(L+reflective plate attachment accuracy), where the attachment accuracy is determined by device accuracy, and for example, the attachment accuracy is 0 mm-0.2 mm. In addition, in order to further improve a light utilization rate of the circuit board, the sizes of the second hollows 60 should not be too large, for example, 3 mm>L≥1.5 mm.

Figure 18:
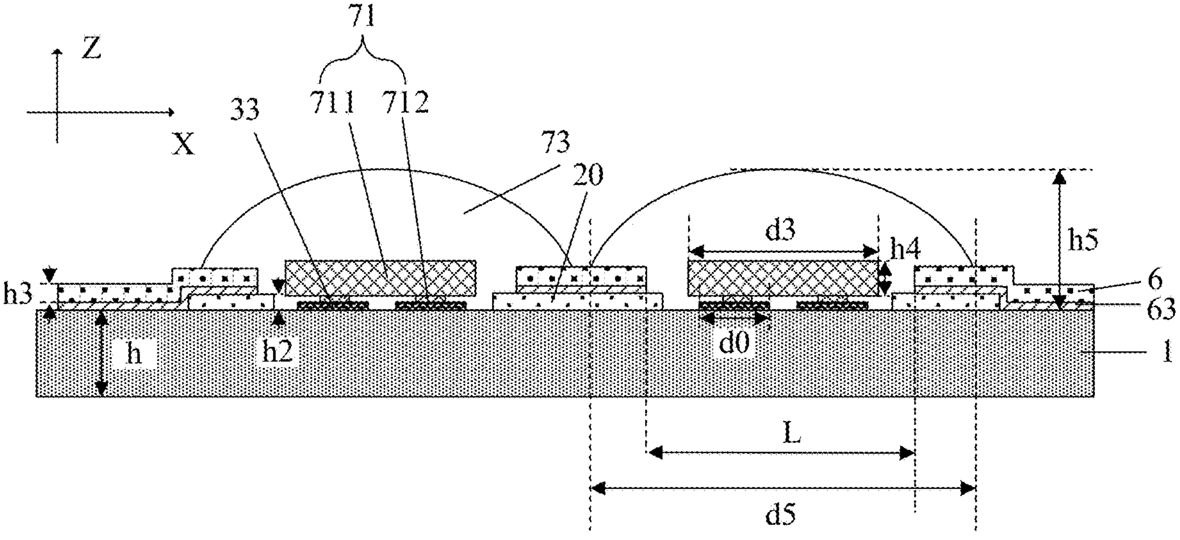
FIG. 18 is a first schematic diagram of a section of an electronic apparatus according to an embodiment of the present disclosure.

In some embodiments, a protective structure may be further arranged on a component. As shown in FIG. 18, a size L of a second hollow 60 is required to be slightly smaller than a size of a contour of an orthographic projection of a protective structure 73 on the substrate 1, such that there is an overlapping zone between the second reflective layer 6 and the protective structure 73, and the second reflective layer and the protective structure may be in partial contact with each other and are fixed to each other more firmly.

Furthermore, as shown in FIG. 14, whether one reflective pattern 2 on the circuit board surrounds only one pad zone 3 is determined according to spacing P between adjacent pad zones 3, a size L0 of an outer contour of the reflective pattern 2 and accuracy of a patterning process. If spacing P between any two components on the circuit board is greater than (L0+process accuracy), that is, minimum spacing between two adjacent reflective patterns 2 (such as L1 or L1') is greater than 0, such that a mode of surrounding each pad zone 3 with one reflective pattern 2 may be selected. It may be understood that if spacing between some pad zones 3 on the circuit board does not satisfy the above condition, minimum spacing between two adjacent reflective patterns 2 (such as L1 or L1') may be smaller than or equal to 0, that is, there is an overlapping zone between the two reflective patterns 2, which are interconnected. In this case, it may be considered that a plurality of pad zones 3 which are close to each other are surrounded by one reflective pattern 2.

It may be understood that first elements are configured to achieve a main function of the circuit board, and a plurality of first elements are arranged according to a certain rule and have a high arrangement density, such that spacing between the first elements is small. The number of second elements (such as micro-integrated circuits (ICs) or sensors) is small, such that the second elements are only arranged in local positions of the circuit board, and for example, a second element is generally arranged in a gap between two adjacent first elements. Therefore, if a second element is arranged between two adjacent first elements, and for example, a geometric center connecting line of the two adjacent first elements overlaps at least one second element, the two first elements and at least one second element located between the first elements are surrounded with one reflective pattern 2.

Furthermore, one circuit board may be provided with various reflective patterns 2 with different outer contour shapes.

In the case that a first element is a light emitting diode, in some embodiments, a function of arranging a second reflective layer 6 is to further improve a light utilization rate, and for a non-optical functional element, for example, a second element, on the circuit board the second reflective layer 6 may be provided with no hollows in a zone where the non-optical functional element is located. However, in this case, attachment smoothness of the second reflective layer 6 may be influenced. In order to improve the problem, a cross-shaped or linear seam may be provided at a position of the second reflective layer 6 corresponding to the zone where the non-optical functional element is located.

In some embodiments, as shown in FIG. 15, one device zone 5 includes four first pad zones 31 (configured to weld first elements) and one second pad zone 32 (configured to weld a second element), and for example, the four first elements are connected in series, alternatively, the first elements are connected in parallel in pairs and then connected in series, and alternatively, the four first elements are connected in parallel, which is not limited herein. One second pad zone 32 is located in a quadrangle defined by connecting geometric centers of four first pad zones 31 in sequence.

All elements in one device zone 5 are surrounded with one reflective pattern 2, that is, all the elements in one device zone 5 are distributed in the zone surrounded with an outer contour of the reflective pattern 2, and first hollows 30 in the reflective pattern 2 expose respective pad zones 3. The first elements have different sizes from the second elements, such that first pad zones 31 have different shapes and sizes from second pad zones 32, and accordingly, the first hollows 30 corresponding to the pad zones 3 have different shapes and sizes. That is, second hollows 60 in the second reflective layer 6, for example, second hollows 60 corresponding to the first pad zones 31 and second hollows 60' corresponding to the second elements, may also have different sizes. For example, the second hollows 60 and 60' all have shapes of circles, with diameters of L and L' respectively, where L'>L.

In some embodiments, one device zone 5 may include more first elements, and a connection relation between a plurality of first elements may be selected and designed as required. Moreover, an arrangement mode of first elements belonging to the same device zone 5 is not limited to array arrangement in directions X and Y and may be also different, which is not limited herein.

Figure 16:
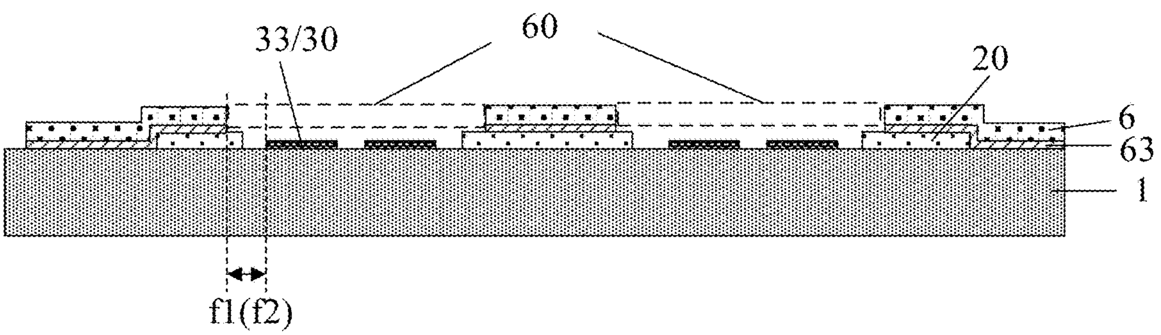
FIG. 16 is a third schematic diagram of a section of a circuit board according to an embodiment of the present disclosure.

In a possible implementation mode, as shown in FIG. 16, FIG. 16 is a schematic diagram of a section along a dotted line AA' in FIG. 15. An adhesive layer 63 is further arranged between a second reflective layer 6 and a first reflective layer 20, and the second reflective layer 6 is attached to the first reflective layer 20. Specifically, the adhesive layer 63 may be provided with third hollows in zones corresponding to second hollows 60, and then first elements may be arranged in and connected to first welding zones 31, and alternatively, second elements may be arranged in and connected to second welding zones 32.

In a possible implementation mode, a viscosity of the adhesive layer 63 ranges from 800 Pa·s to 2000 Pa·s. In general, in order to enhance adhesion of the second reflective layer 6 (for example, a reflective plate) to the first reflective layer 20, a viscosity of an adhesive film of the second reflective layer 6 is required to be large (>3000 Pa·s), and a subsequent dispensing process (for example, forming protective structures of light-emitting elements) and high-temperature baking (100° C.-150° C.) after dispensing may further enhance stress of the substrate, and further increase a warp degree of the substrate. In order to solve the problem, in the embodiment of the present disclosure, the viscosity of the adhesive layer 63 ranges from 800 Pa·s to 2000 Pa·s, and the warp degree of the circuit board may be reduced by reducing the viscosity of the adhesive layer 63 on the second reflective layer 6 on the premise of ensuring the adhesion.

In a possible implementation mode, as shown in FIGS. 13, 14 and 18, an outer contour of a reflective pattern 2 has a shape of a circle, rectangle, polygon or oval, and a pad zone 3 has a shape of a rectangle. In the embodiment of the present disclosure, the pad zones 3 have shapes of rectangles, and shapes of the pad zones 3 are the same as or similar to shapes of orthographic projections of elements to be connected to pads in the pad zones 3 on the substrate 1, such that the elements may be easily welded to the pad zones 3. In the embodiment of the present disclosure, firstly, a plurality of reflective patterns 2 of a first reflective layer are formed on a circuit board; then, a second reflective layer 6 with second hollows 60 is formed at one side of the first reflective layer 20 facing away from the substrate 1; then, an element (such as a first element 71) is welded to a pad 33; and next, a protective structure 73 is arranged at one side of the element (such as the first element 71) away from the substrate 1 through a drip or printing process, so as to protect the element against external water and oxygen erosion. Because the protective structure 73 needs to cover the second hollow 60 of the second reflective layer 6, and the protective structure 73 is manufactured through dripping or printing, an orthographic projection of the protective structure on the substrate 1 as a shape of a circle or oval. To ensure product uniformity and reduce process errors and difficulty, a shape of an orthographic projection of the second hollow 60 on the substrate 1 is similar to a shape of an orthographic projection of the protective structure 73 on the substrate 1, that is, the orthographic projection of the second hollow 60 on the substrate 1 has a shape of a circle, regular polygon or oval. In some embodiments, in order to facilitate alignment or attachment of the second reflective layer 6 with the first reflective layer, a shape of an orthographic projection of an outer contour of a reflective pattern 2 on the substrate 1 remains similar to a shape of an orthographic projection of a second hollow 60 on the substrate 1, that is, an orthographic projection of the outer contour of the reflective pattern 2 on the substrate 1 has a shape of a circle, rectangle, polygon, or oval.

FIG. 17A shows results obtained by testing warp values of a quadrilateral substrate after first reflective layers with different film patterns are arranged on the substrate and eight sites are selected at equal intervals in each of four zones close to four edges of the substrate. The first reflective layer on sample 1 and sample 2 is an integral film layer with all parts interconnected; the first reflective layer 20 on sample 3 and sample 4 includes a plurality of mutually spaced reflective patterns 2, and at least one device zone 5 is distributed on each of the reflective patterns 2, such as reflective pattern 2 shown in FIG. 3 or 9; and the first reflective layer 20 on sample 5 and sample 6 includes a plurality of mutually spaced reflective patterns 2, and only one pad zone 3 is distributed on each of the reflective patterns 2, such as the reflective patterns 2 shown in FIG. 6. It may be seen from FIG. 17A that a maximum warp value of the first reflective layer on the sample 1/sample 2 is 1.4 mm, and maximum warp values of the first reflective layers on the sample 3/sample 4 and the sample 5/sample 6 are 0.65 mm and 0.45 mm, respectively. A first reflective layer is designed to have a plurality of mutually spaced reflective patterns, such that tensile stress generated due to the fact that the first reflective layer needs to be basically in a high temperature condition (such as curing) during manufacturing may be reduced, and the warp value of the substrate is further reduced.

Furthermore, for example, when a viscosity of an adhesive layer 63 on a second reflective layer 6 is 3000 Pa·s, the second reflective layer 6 is pre-baked at a high temperature before the second reflective layer 6 is attached to the first reflective layer 20. The second pre-baked reflective layer 6 is attached, and a warp degree of the circuit board is measured as shown in FIG. 17B. FIG. 17B shows results obtained by testing warp values of a quadrilateral substrate after the substrate is taken as a test object, a second reflective layer is arranged on the substrate, whether the second reflective layer is baked before arrangement and a viscosity of an adhesive layer for arranging the second reflective layer are compared, and eight sites are selected at equal intervals in each of four zones close to the four edges of the substrate. For the sample 1 and the sample 2, an adhesive layer with a viscosity of 3000 Pa·s is selected, and a second reflective layer that is not baked is arranged on the substrate. For the sample 3 and the sample 4, an adhesive layer with a viscosity of 3000 Pa·s is selected, and a second reflective layer that is baked is arranged on the substrate. For the sample 5 and the sample 6, an adhesive layer with a viscosity of 800 Pa·s is selected, and a second reflective layer that is not baked is arranged on the substrate. It may be seen from FIG. 17B that when an adhesive layer with the same viscosity is used, a maximum warp degree of the substrate is 4.75 mm after the second reflective layer 6 that is not baked is arranged on the substrate, and a maximum warp degree of the substrate is 3.5 mm after the second reflective layer 6 is baked and then attached to the substrate, which significantly reduces the warp degree. As shown in FIG. 17B, when a viscosity of an adhesive layer 63 on the second reflective layer 6 is 3000 Pa·s, a maximum warp degree of the substrate is 4.75 mm, and when a viscosity of an adhesive film is reduced to 800 Pa·s, a maximum warp degree of the substrate is reduced to 3.85 mm. Therefore, after the viscosity of the adhesive layer 63 is reduced, the warp degree of the substrate may be reduced accordingly.

Based on the same inventive concept, an embodiment of the present disclosure further provides an electronic apparatus. The electronic apparatus includes the circuit board provided in the embodiment of the present disclosure, and a plurality of first elements 71 and/or a plurality of second elements 72, where each of the plurality of first elements 71 is connected to the first element pad zone 31, and each of the plurality of second elements 72 is connected to the second element pad zone 32.

During specific implementation, as shown in FIG. 18, FIG. 18 may be a schematic diagram of a section along a dotted line AA' in FIG. 15 after the elements are connected to pads. The first elements 71 may be light-emitting elements. Each light-emitting element may include a light-emitting part 711 and a pin 712, and the light-emitting element may be either a mini light emitting diode (Mini LED) or a micro light emitting diode (Micro LED). A size of the Mini LED is greater than or equal to 80 μm and smaller than 500 μm; and a size of the Micro LED is smaller than 80 μm. One side of the light-emitting element facing away from a substrate 1 may further be provided with a protective structure 73, and a surface of the protective structure 73 away from the substrate 1 may be curved. The second elements may be micro control chips configured to control light emission of the light-emitting elements in the same device zone 5. As shown in FIGS. 16 and 18, the protective structures 73 may fill zones where first hollows 30 of a first reflective layer 20 are located, and fill zones where second hollows 60 of a second reflective layer 6 are located, and adhesive layers 63 are located in zones corresponding to the second hollows 60. Specifically, as shown in FIGS. 15 and 18, a size h of the substrate 1 in a direction Z is in a range of 0.5 mm-1.0 mm. Specifically, h may be in a range of 0.6 mm-0.8 mm, for example, and specifically, h may be 0.7 mm, for example. The substrate 1 may include an organic resin material such as epoxy resin, triazine, silicon resin, or polyimide. In some exemplary embodiments, the substrate 1 may be a FR4 printed circuit board (PCB), or a flexible PCB that is easy to deform. In some exemplary embodiments, the substrate 1 may include a ceramic material such as silicon nitride, AlN or $Al_2O_3$, or metal or a metal compound, and the substrate 1 may be a metal core printed circuit board (MCPCB), a metal copper clad laminate (MCCL), etc. A width do of a pad 33 in each pad zone 3 in a direction parallel to a first direction X may be in a range of 150 μm-250 μm. Specifically, do may be in a range of 180 μm-220 μm, for example. Alternatively, specifically, do may be 200 μm, 202 μm, 204 μm, or 206 μm. Specifically, a size h2 of the first reflective layer 20 in the direction Z may be in a range of 10 μm-50 μm. Specifically, h2 may be in a range of 20 μm-40 μm, for example. Specifically, h2 may be 25 μm, 30 μm, 35 μm, or 40 μm, for example. Specifically, a width of the first reflective layer 20 in a direction parallel to the first direction X may be designed according to a shape and a size of the specific reflective patterns 2, which is not limited in the embodiment of the present disclosure. Specifically, a size h3 of a second reflective layer 6 in the direction Z may be in a range of 80 μm-120 μm. Specifically, h3 may be in a range of 90 μm-110 μm, for example. Specifically, h3 may be 95 μm, 100 μm, 105 μm, or 110 μm, for example. Specifically, a size h4 of a first element 71 in the direction Z may be in a range of 80 μm-120 μm, and h4 may be in a range of 90 μm-110 μm. Specifically, h4 may be 95 μm, 100 μm, 105 μm, or 110 μm, for example. Specifically, a width d3 of the first element 71 in the first direction X may be in a range of 300 μm-500 μm, and d3 may be in a range of 350 μm-450 μm. Specifically, d3 may be 390 μm, 400 μm, 410 μm, or 420 μm, for example. Specifically, when a protective structure 73 is hemispherical, a size h5 of the hemispherical protective structure 73 in the direction Z may be in a range of 0.3 mm-0.8 mm. Specifically, h5 may be in a range of 0.4 mm-0.7 mm, for example. Specifically, h5 may be 0.45 mm, 0.5 mm, 0.55 mm, or 0.6 mm, for example. Specifically, a diameter d5 of the hemispherical protective structure 73 may be in a range of 2.0 mm-3.0 mm. Specifically, d5 may be in a range of 2.3 mm-2.7 mm, for example. Specifically, d5 may be 2.3 mm, 2.4 mm, 2.5 mm, or 2.6 mm, for example.

Specifically, when the protective structure 73 is provided through a drip or printing process, air bubbles may enter a zone to be surrounded of the protective structure 73, and the air bubbles may remain in the above zone because the protective structure 73 needs to be cured and molded at a high temperature later. Therefore, a surface of one side of the first reflective layer 20, the adhesive layer 63 and/or the second reflective layer 6 facing an element may have an included angle in a range of 30°-80° with a plane where the substrate 1 is located, for example, such that gas discharge is facilitated in the drip or printing process.

Figure 19:
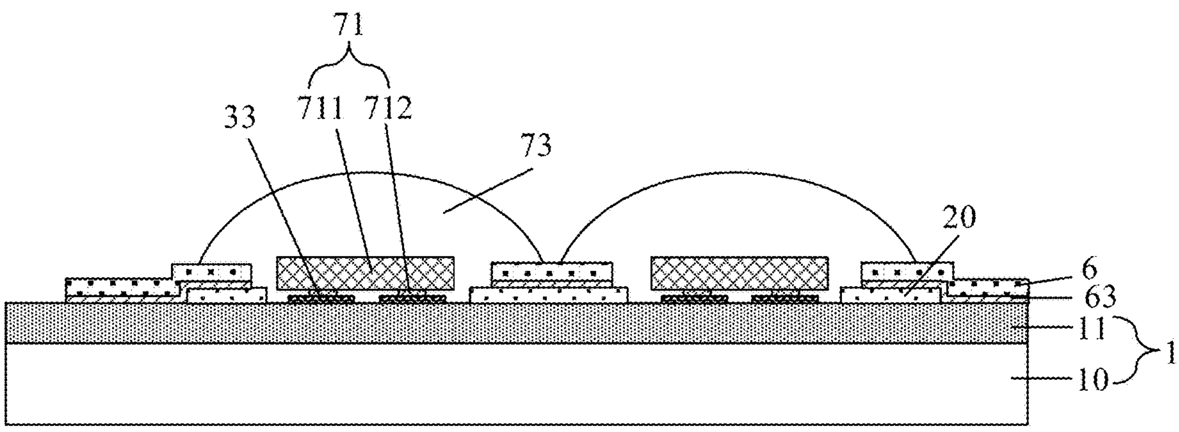
FIG. 19 is a second schematic diagram of a section of an electronic apparatus according to an embodiment of the present disclosure.

In a possible implementation mode, as shown in FIG. 19, FIG. 19 may be a schematic diagram of another section along the dotted line AA' in FIG. 15 after the elements are connected to pads. The substrate 1 may include a base substrate 10 and a first wiring layer 11 arranged at one side of the base substrate 10 facing the first reflective layer 20. Specifically, the first wiring layer 11 may be a single wiring layer, and alternatively, the first wiring layer 11 may be a composite layer including a plurality of wiring sub-layers, and an insulating layer may be arranged between adjacent wiring sub-layers. Specifically, for example, one of the wiring sub-layers may be configured to be laid with series lines for connecting different first elements in the same device zone 5 in series, and another of the wiring sub-layers may be configured to be laid with voltage wires or other signal wires for providing electrical signals for the device zone.

Figure 20:
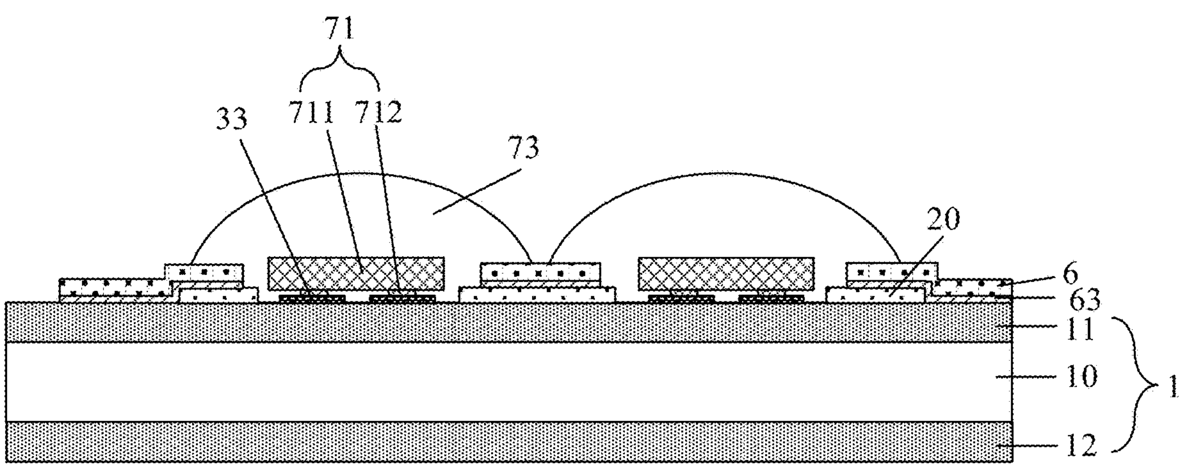
FIG. 20 is a third schematic diagram of a section of an electronic apparatus according to an embodiment of the present disclosure.

In a possible implementation mode, as shown in FIG. 20, FIG. 20 may be a schematic diagram of another section along the dotted line AA' in FIG. 15 after the elements are connected to pads. The substrate 1 may include a base substrate 10 and a first wiring layer 11 arranged at one side of the base substrate 10 facing the first reflective layer 20, and may further include a second wiring layer at one side of the base substrate 10 away from the first wiring layer 11. Specifically, the first wiring layer 11 may be a single wiring layer and configured to be laid with series lines for connecting different first elements in the same device zone 5 in series, and the second wiring layer 12 may be a single wiring layer and configured to be laid with voltage wires or other signal wires for providing electrical signals for the device zone.

Figure 21:
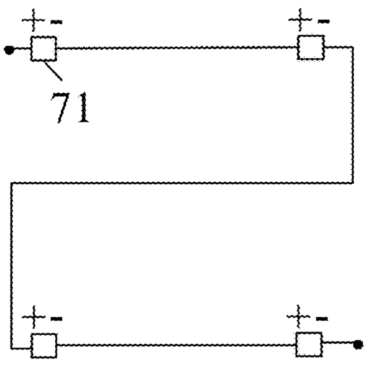
FIG. 21 is a schematic diagram of series connection of different light-emitting elements in the same light-emitting zone according to an embodiment of the present disclosure.

In a possible implementation mode, as shown in FIG. 21, all the first elements 71 in the same device zone 5 are connected sequentially in series.

In a possible implementation mode, all the first elements 71 in the device zone 5 are electrically connected to the second element 72 in the same device zone 5.

Figure 22:
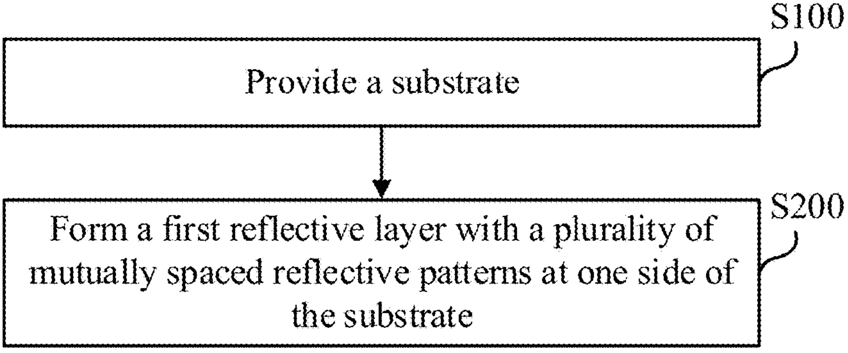
FIG. 22 is a first schematic diagram of a manufacturing process of a circuit board according to an embodiment of the present disclosure.

Based on the same inventive concept, an embodiment of the present disclosure further provides a manufacturing method for the circuit board provided in the embodiment of the present disclosure. As shown in FIG. 22, the manufacturing method includes the following steps.

S100, a substrate is provided. Specifically, as shown in FIG. 19, the substrate 1 may include a base substrate 10 and a first wiring layer 11 arranged at one side of the base substrate 10. Specifically, the first wiring layer 11 may be a single wiring layer, and alternatively, the first wiring layer 11 may be a composite layer including a plurality of wiring sub-layers, and an insulating layer may be arranged between the adjacent wiring sub-layers. Specifically, for example, one of the wiring sub-layers may be configured to be laid with series lines for connecting different first elements in the same device zone 5 in series, and the other wiring sub-layer may be configured to be laid with voltage wires or other signal wires for providing electrical signals for the device zone. Alternatively, as shown in FIG. 20, the substrate 1 may include a base substrate 10 and a first wiring layer 11 arranged at one side of the base substrate 10, and may further include a second wiring layer 12 at one side of the base substrate 10 away from the first wiring layer 11. Specifically, the first wiring layer 11 may be a single wiring layer and configured to be laid with series lines for connecting different first elements in the same device zone 5 in series, and the second wiring layer 12 may be a single wiring layer and configured to be laid with voltage wires or other signal wires for providing electrical signals for the device zone. Specifically, the substrate 1 may further include a plurality of pads 33 on the first wiring layer 11.

S200, a first reflective layer with a plurality of mutually spaced reflective patterns is formed at one side of the substrate.

In a possible implementation mode, S200 that a first reflective layer with a plurality of mutually spaced reflective patterns is formed at one side of the substrate includes the following.

S211, a first reflective film is coated on one side of the substrate.

S212, through a zoned exposure process, the first reflective layer, exposing each pad zone, with the plurality of mutually spaced reflective patterns is formed, where at least one device zone is distributed on each reflective pattern.

In a possible implementation mode, S200 that a first reflective layer with a plurality of mutually spaced reflective patterns is formed at one side of the substrate includes the following.

S221, a first reflective film is coated on one side of the substrate.

S222, through a zoned exposure process, the first reflective layer, exposing each pad zone, with the plurality of mutually spaced reflective patterns is formed, where one pad zone is distributed on each reflective pattern.

Figure 23:
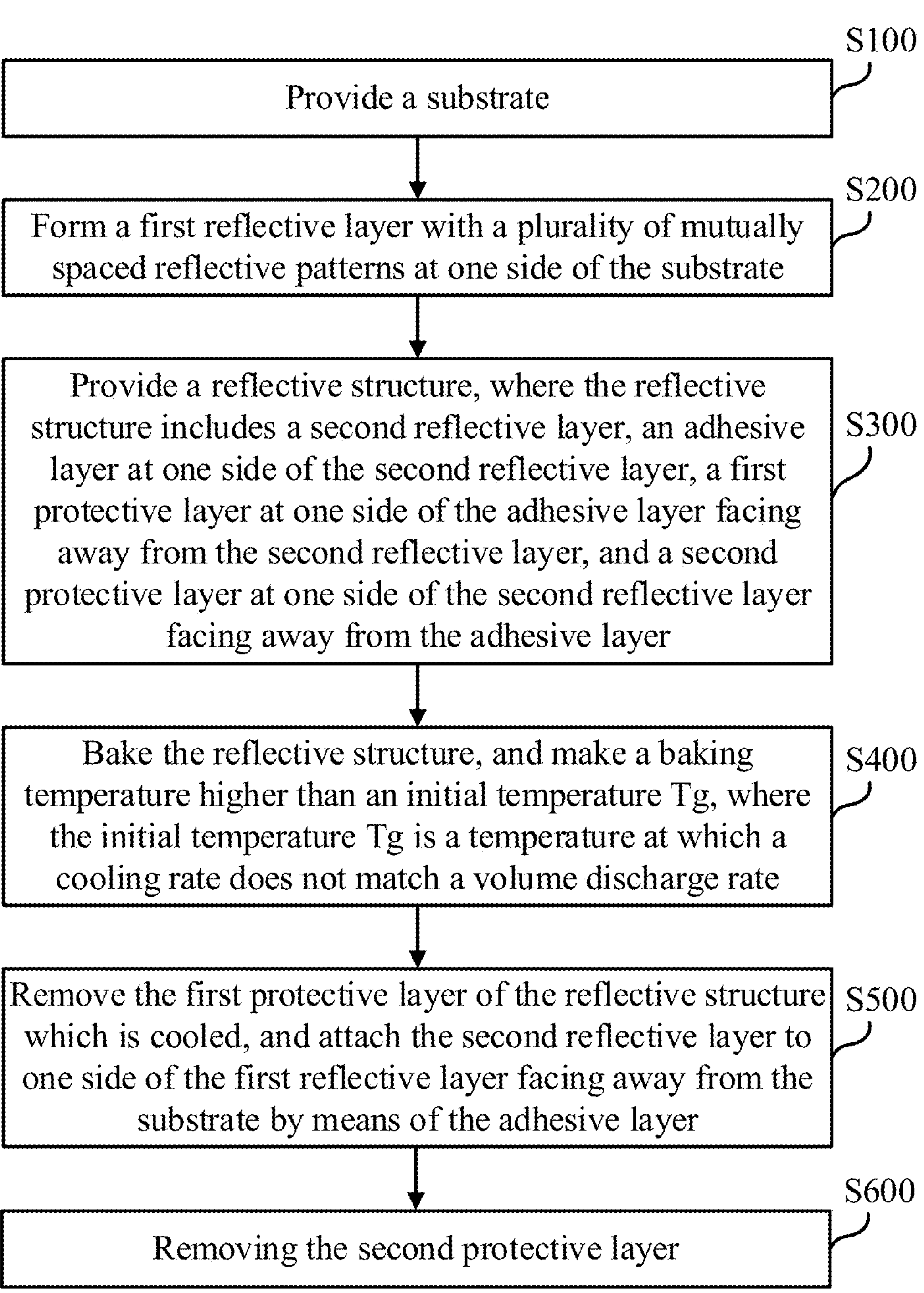
FIG. 23 is a second schematic diagram of a manufacturing process of a circuit board according to an embodiment of the present disclosure.

In a possible implementation mode, as shown in FIG. 23, after S200, that is, after a first reflective layer with a plurality of mutually spaced reflective patterns is formed at one side of the substrate, the manufacturing method further includes the following.

Figure 24:
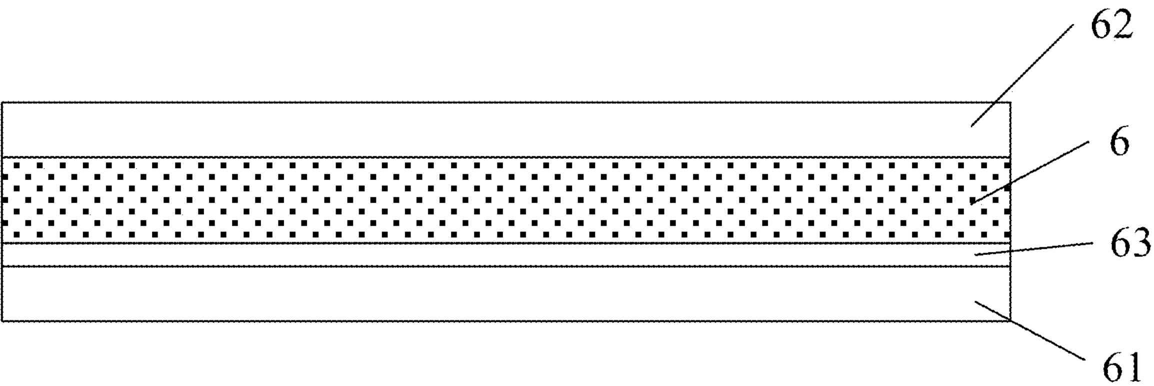
FIG. 24 is a schematic diagram of a reflective structure according to an embodiment of the present disclosure.

S300, a reflective structure is provided, where as shown in FIG. 24, the reflective structure includes a second reflective layer 6, an adhesive layer 63 at one side of the second reflective layer 6, a first protective layer 61 at one side of the adhesive layer 63 facing away from the second reflective layer 6, and a second protective layer 62 at one side of the second reflective layer 6 facing away from the adhesive layer 63.

S400, the reflective structure is baked, and a baking temperature is made higher than an initial temperature Tg, where the initial temperature Tg is a temperature at which a cooling rate does not match a volume discharge rate.

S500, the first protective layer of the reflective structure which is cooled is removed, and the second reflective layer is attached to one side of the first reflective layer facing away from the substrate by means of the adhesive layer.

S600, the second protective layer is removed.

Specifically, after the second protective layer is removed, elements (first elements 71 and/or second elements 72) may be arranged on the pads 33 through a die bonding process; and then an electrical test may be conducted to detect welding between the elements and the pads 33. If a welding defect is detected, a problem may be determined in time and a repair process may be conducted. If the electrical test is passed, a protective structure 73 may be further formed above the element through a drip or printing process.

In the embodiment of the present disclosure, before the second reflective layer 6 is formed on the circuit board, the reflective structure including the second reflective layer 6 may be baked at a high temperature (T>Tg), so as to release a free volume of a reflective plate, and then cooling is conducted naturally so as to make the reflective structure shrink to a free volume corresponding to a room temperature. When the reflective structure is baked at a high temperature again in subsequent manufacturing processes, a volume of the second reflective layer 6 does not decrease/only decreases slightly, and a warp degree of the circuit board may be further reduced.

The embodiment of the present disclosure has the following beneficial effects: in the embodiment of the present disclosure, the first reflective layer includes the plurality of mutually spaced reflective patterns 2, the gap is provided between the adjacent reflective patterns 2, the first reflective layer is formed into the film layer with the plurality of mutually spaced reflective patterns 2, and compared with a first reflective layer with all parts interconnected, the first film layer with the plurality of mutually spaced reflective patterns 2 may release stress so as to avoid warpage of the circuit board when the first reflective layer with all the parts interconnected is formed.

Although preferred embodiments of the present disclosure have been described, those skilled in the art can make additional changes and modifications to the embodiments once they learn the basic inventive concept. Therefore, the appended claims are intended to be interpreted as including the preferred embodiments and all changes and modifications falling within the scope of the present disclosure.

Apparently, those skilled in the art can make various modifications and variations to the embodiments of the present disclosure without departing from the spirit and scope of the embodiments of the present disclosure. In this way, if the modifications and variations of the embodiments of the present disclosure fall within the scope of the claims of the present disclosure and their equivalent technologies, the present disclosure is also intended to include the modifications and variations.

What is claimed is:

1. A circuit board, comprising:

a substrate;

a plurality of pad zones on the substrate;

a first reflective layer, wherein the first reflective layer is at the same side of the substrate as the plurality of pad zones, the first reflective layer is provided with first hollows, each pad zone of the plurality of pad zones is capable of being exposed from a first hollow, the first reflective layer comprises a plurality of reflective patterns which are mutually spaced, and a gap is provided between adjacent reflective patterns; and a second reflective layer at one side of the first reflective layer facing away from the substrate;

wherein the second reflective layer is provided with second hollows in zones where the pad zones are located; and an area of an orthographic projection of a second hollow on the substrate is greater than an area of an orthographic projection of the first hollow on the substrate, and the orthographic projection of the first hollow on the substrate is in the orthographic projection of the second hollow on the substrate;

wherein an orthographic projection of a zone, excluding the second hollow, of the second reflective layer on the substrate at least covers an orthographic projection of the gap between two adjacent reflective patterns on the substrate.

2. The circuit board according to claim 1, wherein all the reflective patterns are provided with the same shape.

3. The circuit board according to claim 1, wherein the orthographic projection of the zone, excluding the second hollow, of the second reflective layer on the substrate partially overlaps an orthographic projection of at least one of the plurality of reflective patterns on the substrate.

4. An electronic apparatus, comprising the circuit board according to claim 1, and a plurality of first elements and/or a plurality of second elements, wherein each of the plurality of first elements is connected to a first element pad zone, and each of the plurality of second elements is connected to a second element pad zone.

5. The circuit board according to claim 1, wherein the second reflective layer comprises a base material, a first film layer at one side of the base material away from the first reflective layer, and a second film layer at one side of the base material facing the first reflective layer.

6. The circuit board according to claim 1, wherein in the circuit board, minimum spacing between each of the second hollows and each of the pad zones in the same orthographic projection is approximately the same.

7. The circuit board according to claim 6, wherein in the first direction, minimum spacing between the second hollow and the pad zone in the orthographic projection is smaller than the minimum spacing between two adjacent pad zones of the plurality of pad zones.

8. The circuit board according to claim 1, wherein an adhesive layer is between the second reflective layer and the first reflective layer.

9. The circuit board according to claim 8, wherein a viscosity of the adhesive layer ranges from 800 Pa·s to 2000 Pa·s.

10. The circuit board according to claim 1, wherein all the reflective patterns are distributed in an array; and minimum spacing between every two adjacent reflective patterns is the same in a first direction, and minimum spacing between every two adjacent reflective patterns is the same in a second direction, wherein the second direction is perpendicular to the first direction.

11. The circuit board according to claim 10, wherein a ratio of minimum spacing between two adjacent pad zones of the plurality of pad zones in the first direction to the minimum spacing between two adjacent reflective patterns in the first direction ranges from 3 to 10; and a ratio of minimum spacing between two adjacent pad zones of the plurality of pad zones in the second direction to the minimum spacing between two adjacent reflective patterns in the second direction ranges from 3 to 10.

12. The circuit board according to claim 10, wherein the minimum spacing between two adjacent reflective patterns in the first direction is greater than 2 mm; and the minimum spacing between two adjacent reflective patterns in the second direction is greater than 2 mm.

13. The circuit board according to claim 1, wherein at least one pad zone of the plurality of pad zones is distributed in a zone surrounded with an outer contour of at least one of the plurality of reflective patterns.

14. The circuit board according to claim 13, wherein a minimum size of any one of the plurality of reflective patterns is greater than a maximum size of a pad zone in the zone surrounded with the outer contour of the reflective pattern, and only one pad zone of the plurality of pad zones is distributed in the zone surrounded with the outer contour of at least one of the plurality of reflective patterns.

15. The circuit board according to claim 14, wherein the outer contour of at least one of the plurality of reflective patterns is provided with a shape different from a pad zone in the zone surrounded with the outer contour of the reflective pattern.

16. The circuit board according to claim 15, wherein the outer contour of at least one of the plurality of reflective patterns is provided with a shape of a polygon, and the pad zone in the zone surrounded with the outer contour of the reflective pattern is provided with a shape of a rectangle.

17. The circuit board according to claim 13, wherein the plurality of pad zones comprise first element pad zones and/or second element pad zones, and a number of pads comprised in each of the first element pad zones is different from a number of pads comprised in each of the second element pad zones.

18. The circuit board according to claim 17, comprising a plurality of device zones, wherein each of the device zones comprises at least one of the first element pad zones and/or at least one of the second element pad zones; and at least one of the device zones is distributed in the zone surrounded with the outer contour of at least one of the plurality of reflective patterns.

19. The circuit board according to claim 17, wherein at least one of the plurality of reflective patterns comprises a first reflective sub-pattern and a second reflective sub-pattern;

at least two of the first element pad zones in the same device zone are distributed in a zone surrounded with an outer contour of the first reflective sub-pattern and distributed in an array; and the second element pad zone in the same device zone is distributed in the second reflective sub-pattern.

20. The circuit board according to claim 19, wherein in at least one of the plurality of reflective patterns, the first reflective sub-pattern and the second reflective sub-pattern are connected to each other and constitute an integrated structure; and a shape of an outer contour of an orthographic projection of at least one of the plurality of reflective patterns on the substrate is similar to a shape of a zone where the first element pad zone and the second element pad zone in the same device zone as the at least one of the plurality of reflective patterns are distribute.

* * * * *